US012656434B2

(12) United States Patent (10) Patent No.: US 12,656,434 B2
Beck et al. (45) Date of Patent: Jun. 16, 2026

(54) RESPIRATORY-STATE RESOLVED MAGNETIC RESONANCE IMAGING

(71) Applicant: KONINKLIJKE PHILIPS N.V., Eindhoven (NL)

(72) Inventors: Gabriele Beck, Venlo (NL); Niklas Hietala, Vantaa (FI); Jonna Falk, Vantaa (FI); Marinus Johan Kruiskamp, Zaltbommel (NL); Guruprasad Krishnamoorthy, Rochester, NY (US); Shashank Sathyanarayana Hegde, Bangalore (IN); Chennakeshava Krishna, Bangalore (IN)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 18/857,483

(22) PCT Filed: Apr. 18, 2023

(86) PCT No.: PCT/EP2023/059975
§ 371 (c)(1),
(2) Date: Oct. 17, 2024

(87) PCT Pub. No.: WO2023/203010
PCT Pub. Date: Oct. 26, 2023

(65) Prior Publication Data
US 2025/0264560 A1 Aug. 21, 2025

(30) Foreign Application Priority Data

Apr. 22, 2022 (NL) ..................................... 2031661

(51) Int. Cl.
*G01R 33/48* (2006.01)
*G01R 33/563* (2006.01)
*G01R 33/565* (2006.01)

(52) U.S. Cl.
CPC ... *G01R 33/4824* (2013.01); *G01R 33/56325* (2013.01); *G01R 33/56509* (2013.01)

(58) Field of Classification Search
CPC .......... G01R 33/4824; G01R 33/56325; G01R 33/56509
See application file for complete search history.

(56) References Cited

U.S. PATENT DOCUMENTS

2013/0281827 A1* 10/2013 Stemmer .................. A61B 5/08
                                                600/534
2014/0035582 A1* 2/2014 Boernert ............ G01R 33/5611
                                                324/312

(Continued)

FOREIGN PATENT DOCUMENTS

WO WO-2020214725 A1 * 10/2020 ............. G01R 33/50

OTHER PUBLICATIONS

Grimm, R., et al., "Self-gated MRI motion modeling for respiratory motion compensation in integrated PET/MRI," Medical Image Analysis. vol 19, 2015. p. 110-120 (Year: 2015).*

(Continued)

*Primary Examiner* — Sean A Frith

(57) ABSTRACT

Disclosed herein is a medical system (100, 400) comprising: a magnetic resonance imaging system (102) configured for providing a respiratory signal. The respiratory signal is descriptive of a respiratory position as well as of inhalation and exhalation of the subject. The execution of machine executable instructions (140) causes the computational system to repeatedly: perform (200) the individual acquisition of k-space data using the magnetic resonance imaging system; receive (202) the respiratory signal; bin (204) the (Continued)

100 individually acquired k-space data into one of a predetermined number of k-space bins (148) using the respiratory signal and perform outlier rejection. Execution of the machine executable instructions further causes the computational system to reconstruct (208) a magnetic resonance image for each of the predetermined number of k-space bins to provide a respiratory-state resolved magnetic resonance image (150).

20 Claims, 14 Drawing Sheets

(56) References Cited

U.S. PATENT DOCUMENTS

| | | | | |
|---|---|---|---|---|
| 2015/0091563 | A1* | 4/2015 | Lu | G06T 11/003 |
| | | | | 324/309 |
| 2016/0324500 | A1* | 11/2016 | Fan | G01R 33/5676 |
| 2017/0361128 | A1* | 12/2017 | Lachaine | G01R 33/4824 |
| 2018/0149721 | A1 | 5/2018 | Beck | |
| 2019/0004132 | A1* | 1/2019 | Tan | G01R 33/56 |
| 2020/0150206 | A1 | 5/2020 | Beck | |
| 2022/0349976 | A1* | 11/2022 | Kunze | G01R 33/56509 |

OTHER PUBLICATIONS

International Search Report and Written Opinion from PCT/ EP2023/ 059975 dated Jun. 29, 2023.

Lianli Liu et al., "Volumetric prediction of breathing and slow drifting motion in the abdomen using radial MRI and multitemporal resolution modeling" Phys. Med. Biol. 66 175026 (2021).

Hassan Haji-Valizadeh et al "Accelerated, free-breathing, noncontrast, electrocardiograph-triggered, thoracic MR angiography with stack-of-stars k-space sampling and GRASP reconstruction" Magnetic Resonance in Med. 81 p. 524-532 (2019).

Rihab Mansour et al., "Abdominal motion tracking with free-breathing XD-GRASP acquisitions using spatio-temporal geodesic trajectories" Medical & Biological Engineering & Computing, vol. 60 p. 583-598 (2022).

Grimm R et al: "Self-gating Reconstructions of Motion and Perfusion for Free-breathing TI-weighted DCE-MRI of the Thorax Using 3D Stack-of-stars GRE Imaging", Apr. 20, 2012 (Apr. 20, 2012), pp. 1-1, XP093029605, Retrieved from the Internet: URL:https://cds. ismrm.org/protected/12MPro ceedings/PDFfiles/0598.pdf [retrieved on Mar. 7, 2023].

Robert Grimm et al: "Self-gated MRI motion modeling for respiratory motion compensation in integrated PET/MRI", Medical Image Analysis, vol. 19, No. 1, Jan. 1, 2015 (Jan. 1, 2015), pp. 110-120.

Bjorn et al "4-Dimensional Magnetic Resonance Imaging Data Sampling for Respiratory Motion Analysis of Pancreatic Tumors", International Journal of Radiation: Oncology Biology Physics., vol. 91, No. 3, Jan. 13, 2015 (Jan. 13, 2015), pp. 571-578.

* cited by examiner perform individual acquisition of k-space data ⟋⟍200 receive the respiratory signal ⟋⟍202 bin the individually acquired k-space data into
one of a predetermined number of k-space bins
using the respiratory signal ⟋⟍204 no    acquisition
finished ?    ⟋⟍206 yes reconstruct respiratory-state resolved magnetic
resonance image from the predetermined number
of k-space bins ⟋⟍208

Tumor trajectory

Respiratory binning

RESPIRATORY-STATE RESOLVED MAGNETIC RESONANCE IMAGING

CROSS REFERENCE TO RELATED APPLICATIONS

This application is a U.S. national phase application of International Application No. PCT/EP2023/059975 filed on Apr. 18, 2023, which claims the benefit of NL Application Serial No. 2031661 filed on Apr. 22, 2022 and is incorporated herein by reference.

FIELD OF THE INVENTION

The invention relates to magnetic resonance imaging, in particular to respiratory-state magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field.

During an MRI scan, Radio Frequency (RF) pulses generated by one or more transmitter coils cause a called B1 field. Additionally applied gradient fields and the B1 field cause perturbations to the effective local magnetic field. RF signals are then emitted by the nuclear spins and detected by one or more receiver coils. These RF signals are recorded as k-space data and are used to reconstruct the MR images, typically using a Fourier or other sparse transform. By repeatedly acquiring the k-space data respiratory-state resolved magnetic resonance images may be acquired. If the k-space data is acquired for a three-dimensional or multi-slice two-dimensional space, then the respiratory-state resolved magnetic resonance images are typically referred to as 4D or four-dimensional magnetic resonance images.

United States patent application publication US 2020/0150206 A1 discloses a method of MR imaging of an object. MR imaging uses the stack-of-stars acquisition scheme with an enhanced control of the contrast of the reconstructed MR image. The method of the invention comprises the steps of: a) generating MR signals by subjecting the object to a number of shots of a multi-echo imaging sequence comprising RF pulses and switched magnetic field gradients, wherein a train of echo signals is generated by each shot; b) acquiring the echo signals according to a stack-of-stars (i.e. a hybrid radial 3D acquisition scheme wherein radial sampling is performed in each slice plane and phase encoding is performed along the slice encoding direction) or stack-of-spirals scheme, wherein the echo signals are acquired as radial or spiral k-space profiles arranged at different positions along a slice direction in k-space, wherein echo signals from different k-space slices are acquired in each shot of the imaging sequence and wherein the echo signals are acquired from each k-space slice with different relaxation time weightings; and c) reconstructing at least one MR image of a desired contrast from the acquired echo signals using a k-space weighted image contrast (KWIC) filter. Moreover, the invention relates to a MR device and to a computer program for a MR device.

The publication Grimm R ET AL, "Self-gating Reconstructions of Motion and Perfusion for Free-breathing T1-weighted DCE-MRI of the Thorax Using 3D Stack-of stars GRE Imaging", 20 Apr. 2012, describes a retrospective self-gating technique that can be employed to extract information from a single continuous free-breathing scan acquired with a stack-of-stars 3D VIBE sequence. According to the publication, this technique can be used to compute different sliding-window reconstructions that show a complete 'virtual' respiratory cycle with high spatial resolution, or, alternatively, a time series of the contrast-enhancement at a specified level of inspiration and with high temporal resolution.

The publication ROBERT GRIMM ET AL: "Self-gated MRI motion modeling for respiratory motion compensation in integrated PET/MRI", MEDICAL IMAGE ANALYSIS, DOI: 10.1016/j.media.2014.08.003, describes how MRI self-gating is applied to perform respiratory gating of the MRI data and simultaneously acquired PET raw data. After gated PET reconstruction, the MRI motion model is used to fuse the individual gates into a single, motion-compensated volume with high signal-to-noise ratio (SNR).

The United States patent application publication US 2016/0324500 A1 describes utilizing a continuous spoiled gradient echo sequence with 3D radial trajectory and 1D self-gating for respiratory motion detection. In certain embodiments, data acquired are retrospectively sorted into different respiratory phases based on their temporal locations within a respiratory cycle, and each phase is reconstructed via a self-calibrating CG-SENSE program.

WIPO patent application publication WO 2020/214725 A1 describes a method for proton resonance frequency shift (PRF) and T1-based temperature mapping using a magnetic resonance imaging (MRI) system includes acquiring, using the MRI system, a set of magnetic resonance (MR) data from a region of interest of a subject by performing a variable-flip-angle multi-echo gradient-echo 3D stack-of-radial pulse sequence. The pulse sequence is configured to acquire radial k-space data in a plurality of segments, each segment acquired with each of a plurality of flip angles.

The publication Stemkens Bjorn ET AL: "Optimizing 4-Dimensional Magnetic Resonance Imaging Data Sampling for Respiratory Motion Analysis of Pancreatic Tumors", INTERNATIONAL JOURNAL OF RADIATION: ONCOLOGY BIOLOGY PHYSICS., DOI: 10.1016/j.ijrobp.2014.10.050, describes a study aimed to determine the optimum sampling strategy for retrospective reconstruction of 4-dimensional (4D) MR data for nonrigid motion characterization of tumor and organs at risk for radiation therapy purposes. 2 surrogate signals (external respiratory bellows and internal MRI navigators) and 2 MR sampling strategies (Cartesian and radial) are compared in terms of image quality and robustness.

SUMMARY OF THE INVENTION

The invention provides for a medical system, a computer program product, and a method in the independent claims. Embodiments are given in the dependent claims.

Embodiments may provide for an improved means of making respiratory state resolved magnetic resonance images by binning not only for the respiratory position but also using the inhalation or exhalation state of the subject to assign bins. The motion of tumor in a subject's thoracic, lung, abdomen (liver, pancreas and kidney) or heart region may have a different position depending whether the subject is inhaling or exhaling. This improved binning method may enable the reconstruction of improved respiratory-state resolved magnetic resonance images.

A respiratory-state resolved magnetic resonance image may, for example, be useful for radiotherapy planning. Respiration-induced motion of the abdomen and thorax can hinder the accurate determination of treatment margins for target tumors, as may be useful for radiotherapy planning. Techniques using breath holds and abdominal compression can have consequences for patient comfort and treatment plan reproducibility. To overcome these challenges 4D MRI has been introduced that captures organ or tumor motion in the abdomen and thorax under free-breathing with automatic respiratory state sorting in bins using external or intrinsic breathing signal during the entire acquisition time. Target region, organs at risk may be better targeted or avoided based on breathing states.

As used herein, a respiratory-state resolved magnetic resonance image encompasses a cyclical time-resolved magnetic resonance image. In other words, a respiratory-state resolved magnetic resonance image is a time series of magnetic resonance images that track an entire respiratory cycle of a subject such that the image is resolved for a temporal respiratory cycle and is not resolved for the position of the subject. A respiratory-state resolved magnetic resonance image may therefore captures hysteresis is the motion of a subject during a respiratory cycle.

In one aspect the invention provides for a medical system that comprises a magnetic resonance imaging system that is configured for acquiring k-space data for a field of view of a subject. The magnetic resonance imaging system is configured for providing a respiratory signal. The respiratory signal is descriptive of a respiratory position of the subject. The respiratory signal is further descriptive of inhalation and exhalation of the subject. In other words, the respiratory signal not only details the position of the subject but whether the subject is in the process of inhaling or exhaling. Having a respiratory signal that provides this information may be beneficial because the position of the organs may be slightly different when the subject is inhaling or exhaling for a particular respiratory position.

Respiratory-state binning using the inhalation or exhalation state can be done by sorting on the amplitude of the respiratory signal with the so-called amplitude binning method or the respiratory phase aligning end-expiration or inspiration with the so-called phase binning method.

The medical system further comprises a memory that stores machine-executable instructions and pulse sequence commands. The pulse sequence commands are configured to control the magnetic resonance imaging system to perform the acquisition of the k-space data as multiple acquisitions of k-space data according to a multi-dimensional k-space sampling pattern. The pulse sequence commands are further configured such that the multi-dimensional k-space sampling pattern is varied between each individual k-space data acquisition of the multiple acquisitions of the k-space data. So in other words, the multi-dimensional k-space sampling pattern is changed each time an individual k-space data acquisition is made. Typically, this may be done by rotating the multi-dimensional k-space sampling pattern. A common way of doing this is rotating a particular k-space sampling pattern by the so-called golden angle. This may enable the free acquisition of k-space data which can then be later binned. Because of the rotation or change in the multi-dimensional k-space sampling pattern it is very unlikely that prior acquisitions will overlap each other exactly. This enables the buildup of k-space data in various bins.

The medical system further comprises a computational system. The computational system may be configured for controlling the magnetic resonance imaging system. Execution of the machine-executable instructions causes the computational system to repeatedly perform the individual acquisition of k-space data by controlling the magnetic resonance imaging system with the pulse sequence commands. Execution of the machine-executable instructions further causes the computational system to repeatedly receive the respiratory signal during the individual acquisition of the k-space data. For example, the individual acquisition of k-space data may be stamped or labeled with a particular respiratory signal including both the respiratory position as well as if the subject is in the process of inhaling or exhaling. Execution of the machine-executable instructions further causes the computational system to repeatedly bin the individually acquired k-space data into one of the predetermined number of k-space bins using the respiratory signal and inhalation or exhalation of the subject.

Execution of the machine-executable instructions further causes the computational system to reconstruct a magnetic resonance image for each of the k-space bins to provide a temporally respiratory-state resolved magnetic resonance image of the field of view. This embodiment may be for example beneficial because the inhalation and exhalation of the subject represents a hysteresis movement of the subject. Binning the k-space data according to just respiratory position may result in a lower quality, blurred magnetic resonance image. The improved respiratory-state resolved magnetic resonance image may be useful for providing sharper magnetic resonance images distinguishing tumors and organs at risk over the whole breathing cycle for radiotherapy planning and treatment.

The respiratory signal may be descriptive of the inhalation and exhalation of a subject in a variety of ways. For example, a derivative of the respiratory signal may be used to indicate the inhalation and exhalation. In other cases, the velocity, which is essentially equivalent to the derivative of the respiratory signal, may also be used. In addition, detecting the respiratory signal in feet head and anterior posterior direction (right left motion typically is negligible) can determine inhalation and exhalation hysteresis effects more quantitatively providing a more precise estimate of the breathing hysteresis effects and outliers, including motion vector fields.

Execution of the machine-executable instructions further causes the computational system to repeatedly bin the individually acquired k-space data into a respiratory position histogram. The predetermined number of k-space bins is resolved in terms of position of the subject as well as inhalation and exhalation of the subject. The respiratory position histogram is resolved for the position of the subject and does not differentiate in terms of inhalation and exhalation of the subject. Execution of the machine-executable instructions further causes the computational system to identify respiratory outliers using the respiratory position histogram. The respiratory-state resolved magnetic resonance image is corrected for the respiratory outliers. Respiratory outlier may arise from sudden changes in breathing like sighing, deep in- and expiration, coughing. This correction of the respiratory-state resolved magnetic resonance image may be done in several different ways. In one way, the respiratory outliers are removed from the predetermined number of k-space bins. In this case, they do not contribute to the reconstruction of the respiratory-state resolved magnetic resonance image at all. In other cases, the respiratory-state resolved magnetic resonance image may be reconstructed and the various k-space samples may be given different weighting factors. One way of minimizing the effect of the respiratory outliers would be to give a low or lower weighting value to those particular samples in the predetermined number of k-space bins. In either case, the effect is to improve the quality of the respiratory-state resolved magnetic resonance image.

In another embodiment the multi-dimensional k-space sampling pattern is configured for oversampling a central k-space region. This may be particularly beneficial because this oversampling of the central k-space region may be used in several different ways. In one example, this oversampling of the central k-space region may be useful in correcting for motion of the subject. For example, samples that have higher levels of motion can have their central k-space region given a lower weighting factor or even removed. The k-space data outside of the central k-space region may then be used for reconstructing images. In another example, this oversampling may be used for performing a self-navigation or navigation.

In another embodiment the multi-dimensional k-space sampling pattern is a variable density stack of stars sampling pattern.

In another embodiment the multi-dimensional k-space sampling pattern is a variable density spiral sampling pattern.

In another embodiment the multi-dimensional k-space sampling pattern is a (spiral) Cartesian sampling pattern.

In another embodiment the multi-dimensional k-space sampling pattern is a variable density sampling pattern.

In another embodiment the multi-dimensional k-space sampling pattern is a two-dimensional variable density sampling pattern.

In another embodiment the multi-dimensional k-space sampling pattern is a two-dimensional propeller sampling pattern. A multi-slice two-dimensional propeller sampling with for example a highly desired T2 contrast has an intrinsic high oversampling of the central k-space. Using the respiratory information, the oversampled central k-space can be filtered out using KWIC filtering extracting 4D respiratory-state resolved T2 images within the same multi-slice two-dimensional propeller overview scan.

In another embodiment the multi-dimensional k-space sampling pattern is a Koosh ball sampling pattern.

In another embodiment the multi-dimensional k-space sampling pattern is a floret sampling pattern.

In another embodiment the multi-dimensional k-space sampling pattern is a spiral sampling pattern.

In another embodiment, execution of the machine executable instructions is configured to cause prospective adaptation of the sampling patterns to get a uniform sampling over the respiratory states using for example the golden angle regime.

In another embodiment the medical instrument is configured to provide breathing guidance for distribution over respiratory states. The breathing guidance would guide the patient to breath consistently covering all respiratory states in a uniform, equally distributed, sinusoidal way reducing drifts and outliers.

In another embodiment execution of the machine executable instructions further causes the computational system to perform real-time reconstruction of the individual acquisitions of k-space data to visualize the breathing motion in real-time next to the respiratory-state resolved magnetic resonance image. By real-time the visualization of the breathing motion is appears to be synchronized with respiratory motion of the subject being image. The delay in real-time may for example be on the order of ½ second or the time to make an acquisition of the individually acquired k-space data.

In another embodiment execution of the machine-executable instructions further causes the computational system to apply a k-space weighting filter to the individual acquisitions of k-space data in the predetermined number of k-space bins before reconstructing the magnetic resonance image for each of the k-space bins. The k-space filter is configured to apply a higher weighting value to the central k-space region than outside the central k-space region.

This embodiment may be beneficial because the k-space was sampled at a higher rate in the central region. For this region the samples in the central region may be minimized. This may for example be beneficial in reducing the effects of motion within a bin sharpening and defining the breathing state.

In another embodiment execution of the machine-executable instructions further causes the computational system to adjust the boundaries of the predetermined number of k-space bins. The binning of the individually acquired k-space data could be such that each of the predetermined number of k-space bins has, within a predetermined difference, the same number of individually acquired k-space data. This embodiment may be beneficial because bins may have more k-space than others, so this may for example result in particular bins having a lower signal-to-noise or more artifacts due to undersampling. Equally sized bins may help improve the overall quality of the respiratory-state resolved magnetic resonance image. Another example could be that neighboring bins overlap and share profiles.

In another embodiment the individual acquisitions of k-space data are assigned a weighting by the k-space weighting filter according to a location determined by the respiratory signal. For example, the center of the bin may be given a particular coordinate according to the respiratory signal. The individually acquired k-space data may vary according to their position within the bin according to this coordinate. K-space samples that are closer to the center of the bin or to any other chosen location of the bin may be given a higher weighting factor. This for example may be useful in reducing the effects of motion within a bin reducing blurring. It however also allows to define the encoded breathing state. End expiration and inspiration encoding states could be defined at the outermost breathing states opposed to the center of a bin.

In case of overlapping bins, profiles could be shared with the k-space filter applied using the shared profiles only for higher k-space.

In another embodiment the k-space weighting filter is a k-space weighting image contrast filter. A k-space weighting image contrast filter is also known as a KWIC filter in much of the literature. The use of a k-space weighting image contrast filter may be useful in that it minimizes the central region of radial k-space opposed to the peripheral region. This for example may be useful in constructing magnetic resonance images with reduced motion artifacts or blurring.

In another embodiment the k-space weighting filter is configured for performing a phase correction to correct for motion and/or increased image sharpness according to a gradient entropy measure. This may be beneficial because it may provide for an improved quality of the respiratory-state resolved magnetic resonance image.

The image data reconstructed from the k-space data in the predetermined number of bins can be post processed by different techniques for example providing an average (MIP), a mid breathing position or a vector field representation.

In another embodiment, execution of the machine executable instructions further causes the computational system to calculate extreme respiratory-state resolved image data by calculating a modulus averaging or a complex averaging of extreme inspiration and expiration respiratory states in the respiratory-state resolved magnetic resonance image. The extreme inspiration and expiration respiratory states can be end inspiration, expiration states, but can be also an automated selection of extreme states by gradient entropy comparison and/or selection of pre-selected gating window settings. This may be beneficial because it may provide a model of the end respiratory states of a subject which can be used for radiotherapy planning. This may be useful in constructing radiotherapy control commands which are less likely to cause the irradiation of vital organs of the subject. One could construct the radiotherapy control commands using the respiratory state-resolved segmentation and then check if the extreme inspiration state and/or the extreme expiration state results in unwanted irradiation of vital organs or regions of the subject.

An average of extreme expiration and inspiration positions are suggested. Tumor and organs of risk movement during breathing is represented in a simple but efficient way showing the clinical information but also the motion margin from breathing for radiation therapy planning (quick ITV). One example of an average of extreme expiration and inspiration positions could be an average of end expiration and end inspiration respiratory-states. Another example is selection of extreme states by a gradient entropy measure and an average of this extreme states. Another example is to take pre-selected gating window settings in inspiration/expiration states into account and provide an average of extreme breathing-states within the selected gating window settings. Vice versa a proposed gating setting could be derived from analysis of these extreme breathing-states optimizing radiation therapy. MIPs, surface rendering and other 3D representation of this average data set can be provided for a simple, intuitive representation. Averaging preferably would be done using modulus averaging, however also complex averaging is possible.

In another embodiment the memory further stores a segmentation algorithm configured for outputting a respiratory-state resolved segmentation in response to receiving the respiratory-state resolved magnetic resonance image. For example, a segmentation algorithm may be applied to each of the individual images which make up the respiratory-state resolved magnetic resonance image. Assembling this collection of segmentations may then result in the respiratory-state resolved segmentation. Execution of the machine-executable instructions further causes the computational system to provide the respiratory-state resolved segmentation of the respiratory-state resolved magnetic resonance image by inputting the respiratory-state resolved magnetic resonance image into the segmentation algorithm. This embodiment may be beneficial because the segmentation may be useful for applications such as radiotherapy planning when a subject is breathing.

In another embodiment the memory further stores a radiation therapy system control module configured for outputting control commands for a radiotherapy system in response to receiving the respiratory-state resolved segmentation and a radiotherapy plan as input. Execution of the machine-executable instructions further causes the computational system to provide the radiotherapy control commands in response to inputting the respiratory-state resolved segmentation and the radiotherapy plan into the radiotherapy system control module.

In another embodiment the medical system further comprises the radiotherapy system. Execution of the machine-executable instructions further causes the computational system to control the radiotherapy system to irradiate the subject using the radiotherapy control commands. The irradiation of the subject is at least partially controlled or gated using the respiratory signal.

The radiotherapy system may be implemented in a variety of ways. In some instances, the radiotherapy system is integrated with the magnetic resonance imaging system and the system is capable of performing magnetic resonance imaging before, during and after the radiotherapy. For example, it may be a magnetic resonance image guided LINAC. In other examples, the magnetic resonance imaging system and the radiation therapy system may be separate. For example, the magnetic resonance imaging may be performed at one location and then the subject may be transported to another location and the respiratory signal may be measured on the radiation therapy system also. The multi-dimensional segmentation may still be useful at the second location where only the radiation therapy system is present. In the case where there are two separate locations between the magnetic resonance imaging system and the radiation therapy system restraints and/or vacuum mattress and/or corset may be used to hold the subject in a particular place.

In another embodiment the magnetic resonance image for each of the k-space bins is reconstructed using compressed sensing. This may be particularly beneficial because if there are fewer k-space samples in some bins it may enable a high quality respiratory-state resolved magnetic resonance image to be constructed nonetheless.

In another embodiment the magnetic resonance image for each of the predetermined number of k-space bins is reconstructed using an artificial intelligence-based reconstruction. Likewise, with this embodiment, if there is undersampling of the k-space the use of an artificial intelligence-based reconstruction may be useful for improving the image quality.

In another embodiment the motion signal is a respiratory belt signal.

In another embodiment the motion signal is an intrinsic k-space navigator. An internal source using a startup cycle can be used to extract quantitative motion information allowing for an accurate motion estimate without the need for a respiratory belt placement. Hereby before each shot, a startup echo of the central k space profile allows extracting quantitative motion information from the projection data (in AP, RL and SI as illustrated below) using a band pass filtered center of mass calculation.

In another embodiment the motion signal is a respiratory tube signal. For example, the subject may be breathing through a tube or may be provided with a means of assisting respiration. The respiratory tube signal may then be a measure of the breathing assistance and/or the actual respiration measured from the subject.

In another embodiment the motion signal is a k-space navigator.

In another embodiment the motion signal is an image navigator. For example, individual acquisitions of the k-space data may be reconstructed and this image, although it may not be of sufficient quality for clinical use, may nonetheless identify anatomical locations such that it can provide navigation.

In another embodiment the motion signal is a noise navigator.

In another embodiment the motion signal is a camera-based motion signal. For example, there may be a camera mounted to observe the subject during the acquisition of the k-space data and observation of the motion can be used to provide a navigator signal.

In another embodiment the respiratory-state resolved magnetic resonance image is corrected for the respiratory outliers by deleting outliers from the k-space bins or by giving respiratory outliers a predetermined weighting value during reconstruction of the magnetic resonance image for each of the predetermined number of k-space bins.

In another aspect the invention provides for a computer program product that comprises machine-executable instructions for execution by a computational system controlling a medical system. In some examples the computer program product may also comprise the pulse sequence commands. The medical system comprises a magnetic resonance imaging system configured for acquiring k-space data for a field of view of the subject. The magnetic resonance imaging system is configured for providing a respiratory signal. The respiratory signal is descriptive of a respiratory position of the subject. The respiratory signal is further descriptive of inhalation and exhalation of the subject.

Execution of the machine-executable instructions causes the computational system to repeatedly perform the individual acquisition of k-space data by controlling the magnetic resonance imaging system with the pulse sequence commands. The pulse sequence commands are configured to perform the acquisition of the individual acquisitions of k-space data according to a multi-dimensional k-space sampling pattern. The pulse sequence commands are configured such that the multi-dimensional k-space sampling pattern is varied between each individual k-space data acquisition of the multiple acquisitions of k-space data. Execution of the machine-executable instructions further causes the computational system to repeatedly receive the respiratory signal during the acquisition of the individual acquisitions of k-space data.

Execution of the machine-executable instructions further causes the computational system to repeatedly bin the individually acquired k-space data into one of the predetermined number of k-space bins using the respiratory signal and inhalation or exhalation of the subject. Execution of the machine-executable instructions further causes the computational system to reconstruct a magnetic resonance image for each of the k-space bins to provide a respiratory-state resolved magnetic resonance image of the field of view.

Execution of the machine executable instructions causes the computational system to repeatedly bin the individually acquired k-space data into a respiratory position histogram, wherein the machine executable instructions causes the computational system to identify respiratory outliers using the respiratory position histogram, and wherein the respiratory-state resolved magnetic resonance image is corrected for the respiratory outliers.

In another aspect the invention provides for a method of operating a medical system. The medical system comprises a magnetic resonance imaging system configured for acquiring k-space data for a field of view of the subject. The magnetic resonance imaging system is configured for providing a respiratory signal. The respiratory signal is descriptive of a respiratory position of the subject. The respiratory signal is further descriptive of inhalation and exhalation of the subject. The method comprises repeatedly performing the individual acquisition of k-space data by controlling the magnetic resonance imaging system with the pulse sequence commands. The pulse sequence commands are configured to perform the acquiring of the k-space data as multiple acquisitions of k-space data according to a multi-dimensional k-space sampling pattern. The pulse sequence commands are configured such that the multi-dimensional k-space sampling pattern is varied between each individual k-space data acquisition of the multiple acquisitions of k-space data.

The method comprises repeatedly receiving the respiratory signal during acquisition of the individual acquisitions of the k-space data. The method further comprises repeatedly binning the individually acquired k-space data into one of a predetermined number of k-space bins using the respiratory signal and inhalation or exhalation of the subject. The method further comprises reconstructing a magnetic resonance image for each of the k-space bins to provide a respiratory-state resolved magnetic resonance image of the field of view.

The method comprises repeatedly binning the individually acquired k-space data into a respiratory position histogram, identifying respiratory outliers using the respiratory position histogram, and correcting the respiratory-state resolved magnetic resonance image for the respiratory outliers.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor or computational system of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the computational system of the computing device. Examples of computer-readable storage media include, but are not limited to: a floppy disk, a magnetic hard disk drive, a solid-state hard disk, flash memory, a USB thumb drive, Random Access Memory (RAM), Read Only Memory (ROM), an optical disk, a magneto-optical disk, and the register file of the computational system. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a computational system. 'Computer storage' or 'storage' is a further example of a computer-readable storage medium. Computer storage is any non-volatile computer-readable storage medium. In some embodiments computer storage may also be computer memory or vice versa.

A 'computational system' as used herein encompasses an electronic component which is able to execute a program or machine executable instruction or computer executable code. References to the computational system comprising the example of "a computational system" should be interpreted as possibly containing more than one computational system or processing core. The computational system may for instance be a multi-core processor. A computational system may also refer to a collection of computational systems within a single computer system or distributed amongst multiple computer systems. The term computational system should also be interpreted to possibly refer to a collection or network of computing devices each comprising a processor or computational systems. The machine executable code or instructions may be executed by multiple computational systems or processors that may be within the same computing device or which may even be distributed across multiple computing devices.

Machine executable instructions or computer executable code may comprise instructions or a program which causes a processor or other computational system to perform an aspect of the present invention. Computer executable code for carrying out operations for aspects of the present invention may be written in any combination of one or more programming languages, including an object-oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly. In other instances, the machine executable instructions or computer executable code may be in the form of programming for programmable logic gate arrays.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a computational system of a general-purpose computer, special purpose computer, or other programmable data processing apparatus to produce a machine, such that the instructions, which execute via the computational system of the computer or other programmable data processing apparatus, create means for implementing the functions/acts specified in the flowchart and/or block diagram block or blocks.

These machine executable instructions or computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The machine executable instructions or computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the computational system of a computer system to interact with and/or control an external computing device and/or apparatus. A hardware interface may allow a computational system to send control signals or instructions to an external computing device and/or apparatus. A hardware interface may also enable a computational system to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Medical imaging data is defined herein as being recorded measurements made by a tomographic medical imaging system descriptive of a subject. The medical imaging data may be reconstructed into a medical image. A medical image is defined herein as being the reconstructed two- or three-dimensional visualization of anatomic data contained within the medical imaging data. This visualization can be performed using a computer.

K-space data is defined herein as being the recorded measurements of radio frequency signals emitted by atomic spins using the antenna of a Magnetic resonance apparatus during a magnetic resonance imaging scan. Magnetic resonance data is an example of tomographic medical image data.

A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DESCRIPTION OF EMBODIMENTS

Like numbered elements in these figures are either equivalent elements or perform the same function. Elements which have been discussed previously will not necessarily be discussed in later figures if the function is equivalent.

Figure 1:
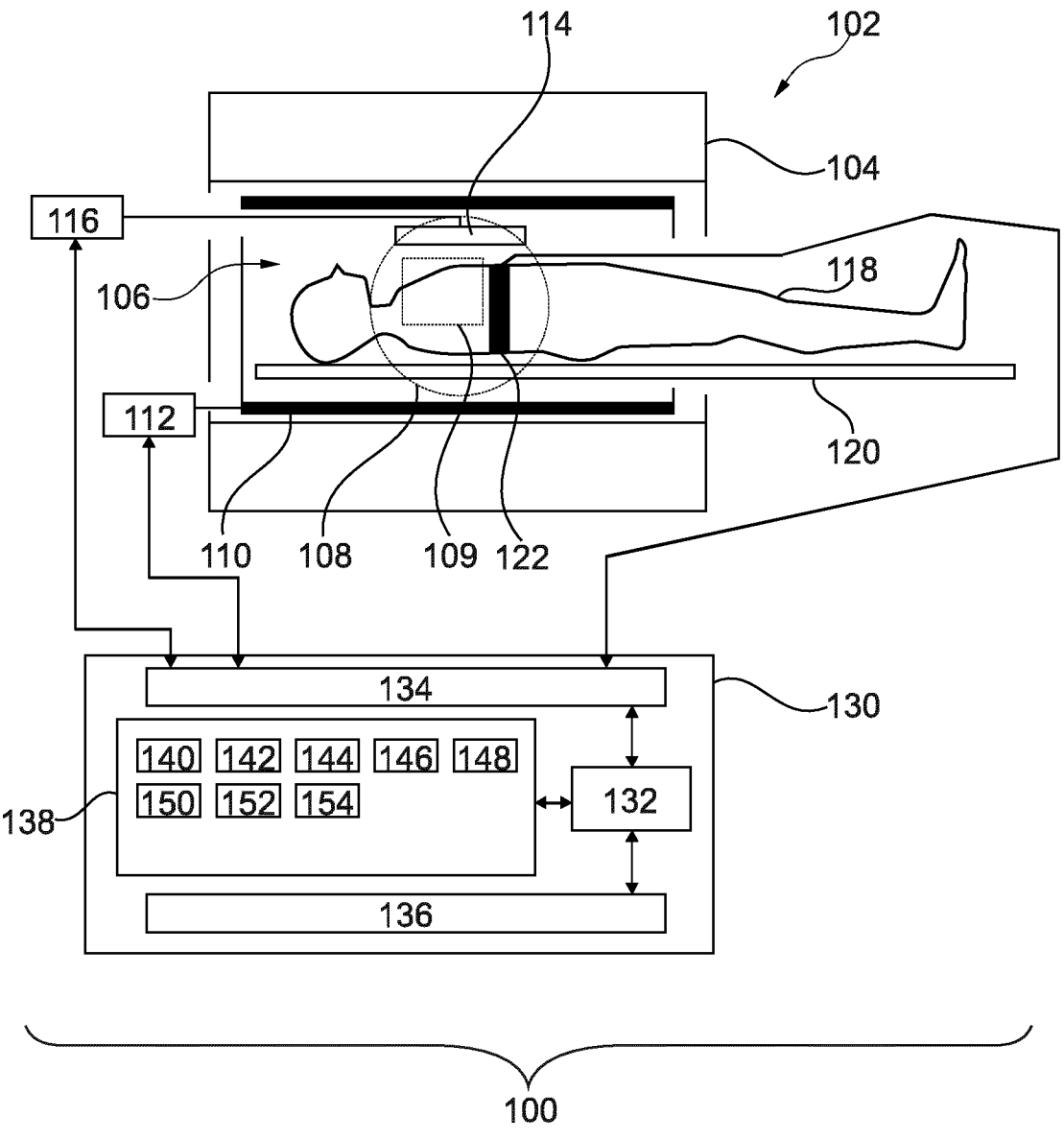
FIG. 1 illustrates an example of a medical system.

FIG. 1 illustrates an example of a medical system 100 that comprises a magnetic resonance imaging system 102 and a computer 130. The magnetic resonance imaging system 102 comprises a magnet 104. The magnet 104 is a superconducting cylindrical type magnet with a bore 106 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 106 of the cylindrical magnet 104 there is an imaging zone 108 where the magnetic field is strong and uniform enough to perform magnetic resonance imaging. A field of view 109 is shown within the imaging zone 108. The magnetic resonance data that is acquired typically acquired for the field of view 109. A subject 118 is shown as being supported by a subject support 120 such that at least a portion of the subject 118 is within the imaging zone 108 and the field of view 109.

Within the bore 106 of the magnet there is also a set of magnetic field gradient coils 110 which is used for acquisition of preliminary magnetic resonance data to spatially encode magnetic spins within the imaging zone 108 of the magnet 104. The magnetic field gradient coils 110 connected to a magnetic field gradient coil power supply 112. The magnetic field gradient coils 110 are intended to be representative. Typically magnetic field gradient coils 110 contain three separate sets of coils for spatially encoding in three orthogonal spatial directions. A magnetic field gradient power supply supplies current to the magnetic field gradient coils. The current supplied to the magnetic field gradient coils 110 is controlled as a function of time and may be ramped or pulsed.

Adjacent to the imaging zone 108 is a radio-frequency coil 114 for manipulating the orientations of magnetic spins within the imaging zone 108 and for receiving radio transmissions from spins also within the imaging zone 108. The radio frequency antenna may contain multiple coil elements. The radio frequency antenna may also be referred to as a channel or antenna. The radio-frequency coil 114 is connected to a radio frequency transceiver 116. The radio-frequency coil 114 and radio frequency transceiver 116 may be replaced by separate transmit and receive coils and a separate transmitter and receiver. It is understood that the radio-frequency coil 114 and the radio frequency transceiver 116 are representative. The radio-frequency coil 114 is intended to also represent a dedicated transmit antenna and a dedicated receive antenna. Likewise the transceiver 116 may also represent a separate transmitter and receivers. The radio-frequency coil 114 may also have multiple receive/transmit elements and the radio frequency transceiver 116 may have multiple receive/transmit channels. For example if a parallel imaging technique such as SENSE is performed, the radio-frequency could 114 will have multiple coil elements.

The transceiver 116 and the gradient controller 112 are shown as being connected to the hardware interface 106 of the computer system 102. In this example, a respiratory belt 122 is seen as being connected to the thorax of the subject 118. The respiratory belt 122 provides the respiratory signal 146. The respiratory signal 146 provides not only the position of the subject's 118 thorax but by looking at the trend or the velocity the inhalation or exhalation of the subject 118 may also be determined.

The medical system 100 is further shown as comprising a computer 130. The computer 130 is intended to represent one or more computing or computational devices located at one or more locations. The computer 130 is shown as containing a computational system 132. The computational system 132 is intended to represent one or more computational systems that could for example be one or more processing cores located at one or more locations. Various combinations of computational systems 132 and/or computers 130 could be connected and work together cooperatively using a network. The computational system 132 is shown as being in communication with a hardware interface 134, a user interface 136, and a memory 138. The hardware interface 134 is an interface which enables the computational system 132 to communicate with and/or control other components of the medical system 100 such as the magnetic resonance imaging system 102. The user interface 136 is a user interface that enables an operator of the medical system 100 to control and operate the medical system 100. The memory 138 is intended to represent various types of memory which may be in communication with the computational system 132.

The memory 138 is shown as containing machine-executable instructions 140. The machine-executable instructions 140 contain instructions which enable the computational system 132 to control the magnetic resonance imaging system 102 as well as perform various data and image processing tasks. The memory 138 is further shown as containing pulse sequence commands 142. The pulse sequence commands 142 are commands or data which may be converted into commands which enable the computational system 132 to control the operation of the magnetic resonance imaging system 102. Often times the pulse sequence commands 142 are in the form of a timing diagram or timing commands which contain information which commands are used to control the magnetic resonance imaging system 102 at a particular time. The memory 138 is further shown as containing individual acquisitions of k-space data 144 that have been acquired from the magnetic resonance imaging system 102 using the pulse sequence commands 142. The memory 138 is further shown as containing the respiratory signal 146 that has been measured using the respiratory belt 122. Although a respiratory belt 122 is shown, various other techniques such as using camera images of the subject 118 or using various k-space navigation techniques may also be used.

As the individual acquisitions of k-space data 144 are acquired, they may be assigned a particular respiratory signal 146. The respiratory signal 146 is then used to bin the individual acquisitions of k-space data 144 into a group of a predetermined number of k-space bins 148. This predetermined number of k-space bins 148 is resolved both in terms of position and the respiratory state of the subject 118. Therefore, it records the inhalation and exhalation as separate bins although the position may be the same. The memory 138 is further shown as containing a respiratory-state resolved magnetic resonance image 150 that has been reconstructed by making an image for each one of the predetermined number of k-space bins 148. This may then be assembled into a respiratory-state resolved magnetic resonance image 150.

The memory is further shown as containing a respiratory position histogram 152. The respiratory position histogram 152 is used to bin the individual acquisitions of k-space data 144 except in this case the respiratory state is ignored and is based purely on the position of the subject 118. The respiratory position histogram 152 is used to identify respiratory outliers or basically when the subject was in an extreme position as measured by the respiratory signal 146. The respiratory outliers 154 may be removed from the group of predetermined number of k-space bins 148 before the respiratory-state resolved magnetic resonance image 150 is reconstructed. Alternatively, weighting factors may be used to reduce the influence of the respiratory outliers 154 on the respiratory state resolved magnetic resonance image 150.

Figure 2:
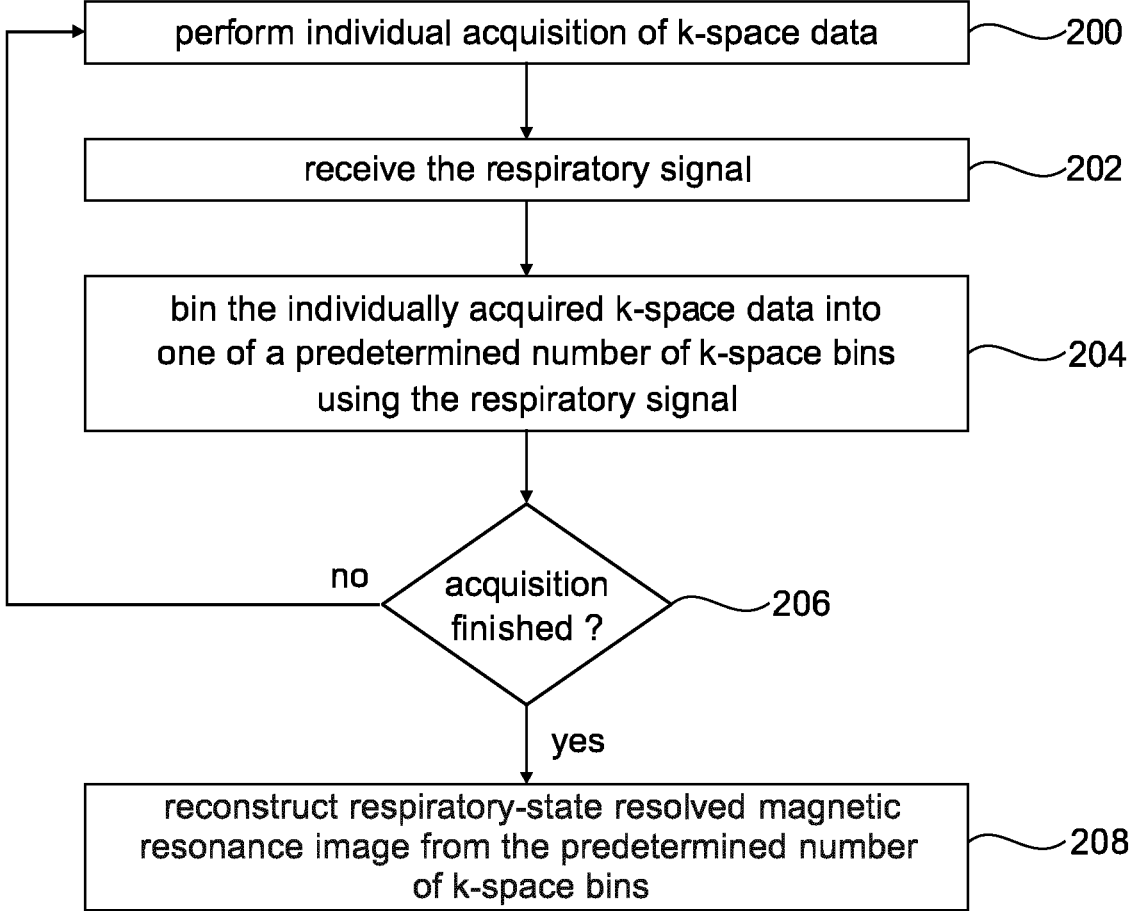
FIG. 2 shows a flow chart which illustrates a method of using the medical system of FIG. 1.

FIG. 2 shows a flowchart which illustrates a method of operating the medical system 100 of FIG. 1. First, in step 200, the individual acquisitions of k-space data 144 are acquired by controlling the magnetic resonance imaging system 102 with the pulse sequence commands 142. At the same time the respiratory signal 146 is received. The particular individual acquisition of k-space data is then paired with the respiratory signal at that time of acquisition 146. Next, in step 204, the individually acquired k-space data 144 is then binned into one of a predetermined number of k-space bins 148 using the respiratory signal 146. This respiratory signal indicates the position of the subject 118 who is breathing as well as the inhalation or exhalation state. The method then proceeds to step 206. Step 206 is a decision box, which is 'is the acquisition finished?' This may for example be for a predetermined number of acquisitions or it may be such that each of the bins has a minimum number of acquisitions. If the answer is no then the method repeats back to step 200 and another individual acquisition of k-space data is acquired and binned. If the answer is yes, the method proceeds to step 208. In step 208 the computational system reconstructs a magnetic resonance image for each of the k-space bins 148 to provide a respiratory-state resolved magnetic resonance image 150.

Figure 3:
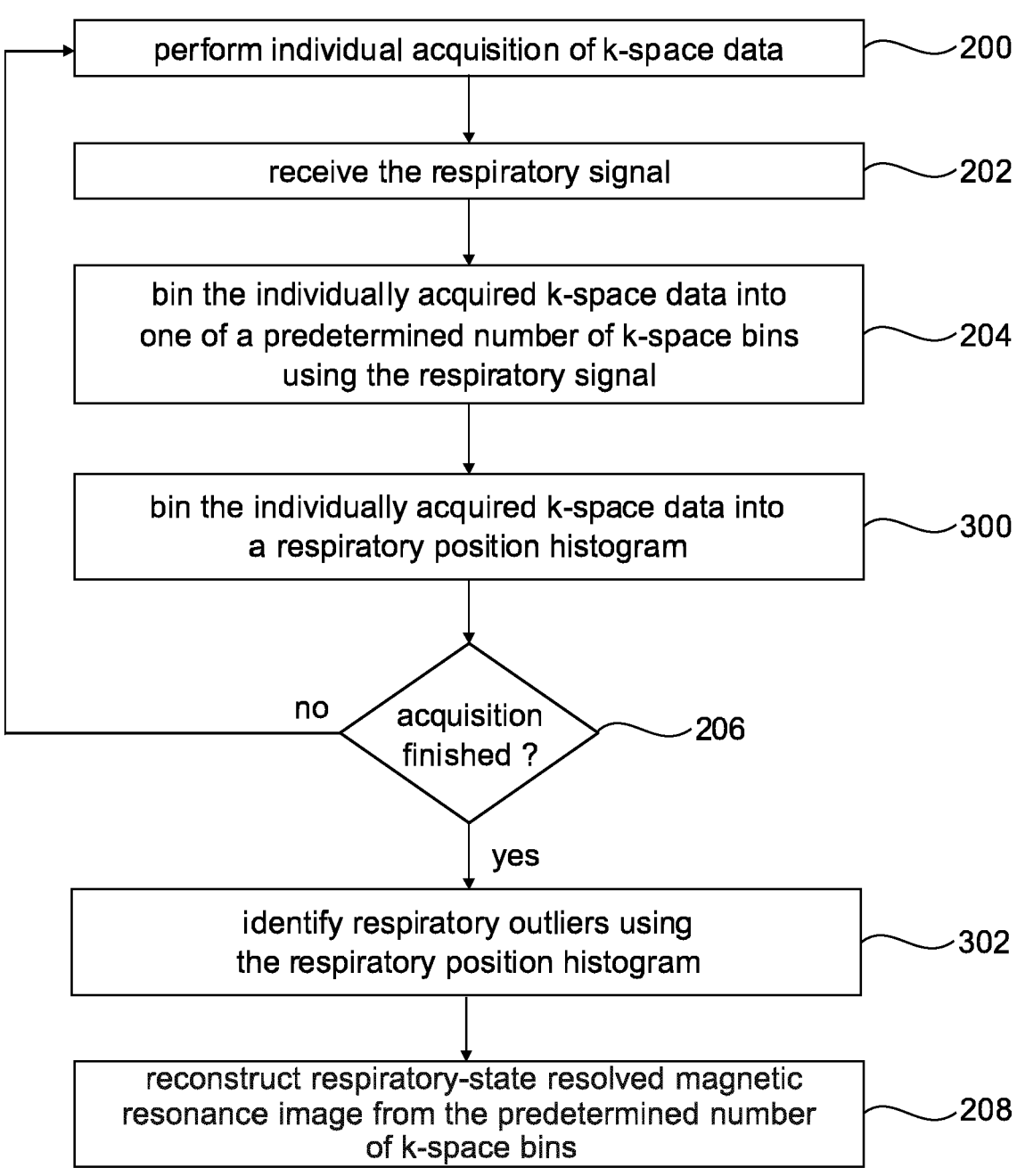
FIG. 3 shows a flow chart which illustrates a further method of using the medical system of FIG. 1.

FIG. 3 illustrates a further method of operating the medical system of FIG. 1. The method illustrated in FIG. 3 is similar to the method illustrated in FIG. 2. In FIG. 3 the method starts with steps 200, 202, and 204 as was illustrated in FIG. 2. Next, in step 300, the individually acquired k-space data 144 is additionally binned into the respiratory position histogram 152. The method then proceeds to step 206 as was illustrated in FIG. 2. When all of the acquisitions are finished the method proceeds to step 302. In step 302, the respiratory outliers 154 are identified in the respiratory position histogram 152. After the respiratory outliers 154 are identified, the method proceeds to step 208, where again the magnetic resonance image for each of the k-space bins is reconstructed. However, this time the respiratory-state resolved magnetic resonance image 150 is corrected for the respiratory outliers 154. This could for example involve removing respiratory outliers 154 from the group of predetermined number of k-space bins 148 or assigning the respiratory outliers 154 a reduced weighting so that they affect the respiratory-state resolved magnetic resonance image 150 less.

Figure 4:
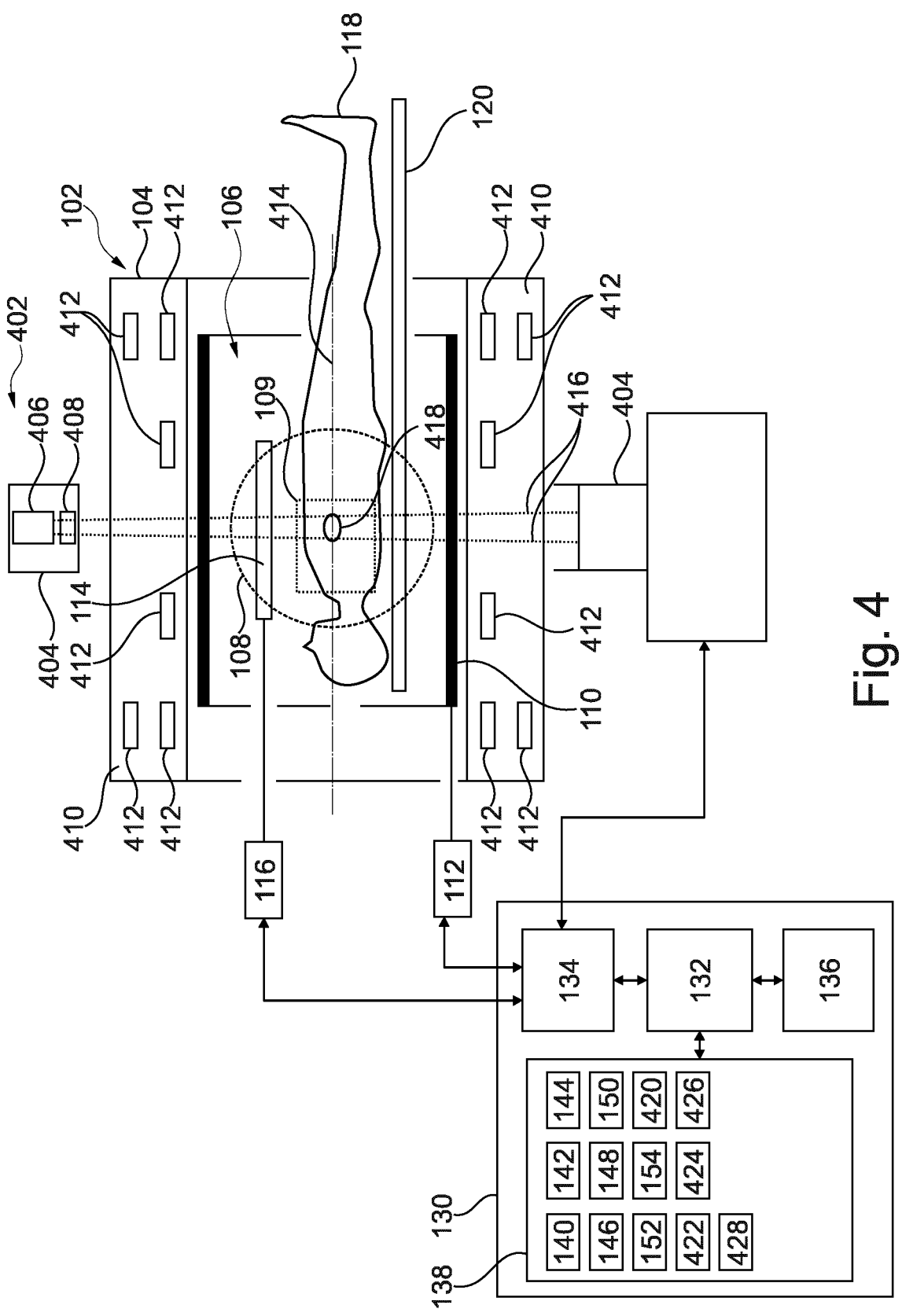
FIG. 4 illustrates a further example of a medical system.

FIG. 4 illustrates a further example of a medical system 400. The medical system 400 depicted in FIG. 4 is similar to that in FIG. 1 except that it additionally comprises a radiation therapy system 402. The radiation therapy system 402 comprises a gantry 404 and a radiotherapy source 406. The gantry 404 is for rotating the radiotherapy source 406 about an axis of gantry rotation or rotational axis 414. Adjacent to the radiotherapy source 406 is a collimator 408.

The magnet 104 shown in this embodiment is a standard cylindrical superconducting magnet. The magnet 104 has a cryostat 410 with superconducting coils 412 within it. A split magnet may also be used instead.

Within the subject 118 there is a target zone 418. The axis of gantry rotation 414 is coaxial in this particular embodiment with the cylindrical axis of the magnet 104. The radiation source 406 is aimed at the axis of rotation 414 such that the radiation source has a target volume about the axis of the rotation 140.

The subject support 120 has been positioned such that the target zone 418 lies on the axis 414 of gantry rotation. The radiation source 406 is shown as generating a radiation beam 416 which passes through the collimator 408 and through the target zone 418. As the radiation source 406 is rotated about the axis 414 the target zone 418 will always be targeted by the radiation beam 416. The radiation beam 416 passes through the cryostat 410 of the magnet 104. The magnetic field gradient coil may have a gap which separate the magnetic field gradient coil into two sections. If present, this gap reduces attenuation of the radiation beam 416 by the magnetic field gradient coil 110. In some embodiments the radio frequency coil 114 may also have gaps or be separated to reduce attenuation of the radiation beam 416.

The memory 138 is further shown as containing a segmentation algorithm 420. The segmentation algorithm 420 may be used to segment the individual images that make up the respiratory-state resolved magnetic resonance image 150 and be used to generate a respiratory-state resolved segmentation 422. The respiratory-state resolved segmentation 422 could for example identify the target location within the subject 118 as well as critical organs which should not be irradiated. Having these in a respiratory-state resolved fashion may be useful in that it may provide for less damage to the subject 118 during irradiation. The memory 138 is shown as containing the respiratory-state segmentation 422 after segmenting the respiratory-state resolved magnetic resonance image 150 with the segmentation algorithm 420. The memory 138 is further shown as containing a radiation therapy system control module 424. The radiation therapy system control module 424 is configured for outputting radiotherapy control commands 428 in response to receiving a radiation therapy plan 426 and the respiratory-state resolved segmentation 422. The radiation therapy plan 426 and the radiotherapy control commands 428 are shown as being stored in the memory 138.

In this example, a respiratory belt is not shown. However, the respiratory signal 146 may for example be derived from the individual acquisitions of k-space data 144, for example, using a self-navigation technique.

Figure 5:
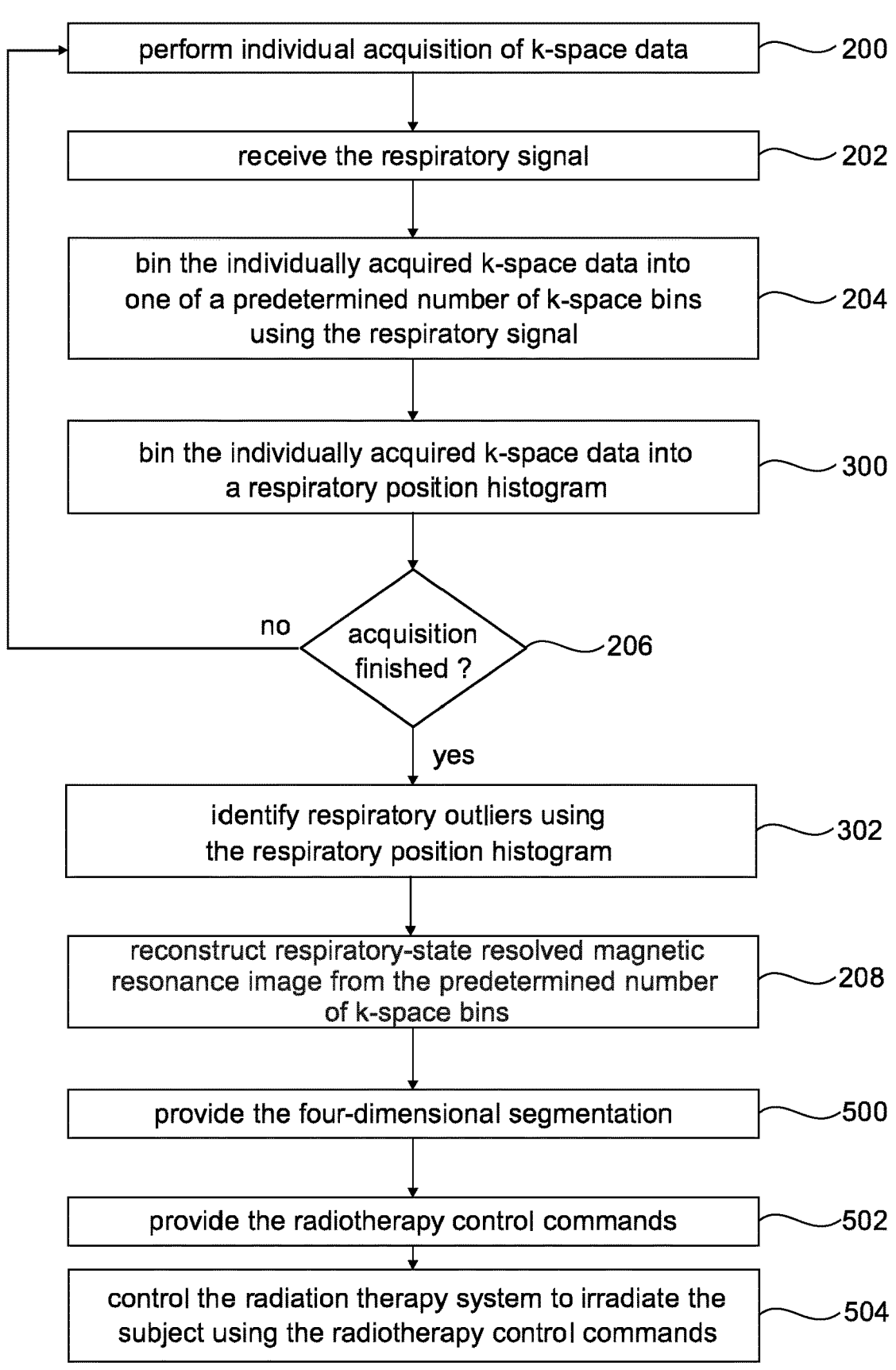
FIG. 5 shows a flow chart which illustrates a method of using the medical system of FIG. 4.

FIG. 5 shows a flowchart which illustrates a method of operating the medical system 400 of FIG. 4. The method in FIG. 5 is similar to that as illustrated in FIG. 3; in fact the method proceeds in performing the steps of FIG. 3. When the method in FIG. 3 ends in step 208 additional steps are performed. After step 208 is performed, in step 500 the respiratory-state resolved segmentation 422 is provided by inputting the respiratory-state resolved magnetic resonance image 150 into the segmentation algorithm 420. Next, in step 502, the radiotherapy control commands 428 are generated by inputting the radiation therapy plan 426 and the respiratory-state resolved segmentation 422 into the radiation therapy system control module 424. Finally, in step 504, the radiation therapy system 402 is controlled to irradiate the subject 118 by controlling it with the radiotherapy control commands 428. It should be noted that in some examples the respiratory signal 146 is acquired during execution of the radiotherapy control commands 428 and the respiratory signal 146 may be used, for example, to gate or adjust the radiotherapy control commands, possibly in real time. Motion robustness may likely be improved by respiratory soft gating.

One type of multi-dimensional k-space acquisition may be performed using 4D radial stack of stars. 4D radial stack of stars based on respiratory binning offers several promising advantages for radiation therapy planning and motion management like significantly higher robustness to motion, benign aliasing artifacts and retrospective respiratory binning possibilities.

Despite the benefits, current technology still does not provide the temporal and spatial fidelity required for 4D motion management, showing in not distinguishing breathing hysteresis effects showing in streaking and signal fluctuations. Distinguishing respiratory hysteresis effects are important for MR Radiotherapy since the treated area may move differently between inspiration to expiration or expiration to inspiration respiratory states.

Some examples may provide for an improve multi-dimensional or 4D binning scheme.

Figure 6:
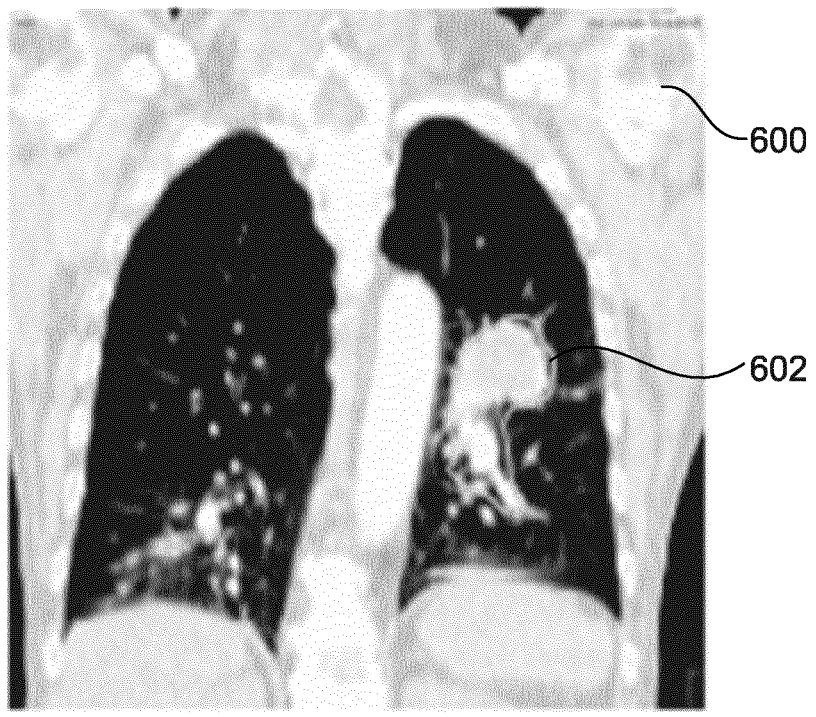
FIG. 6 illustrates a motion hysteresis effect caused by respiration.
Figure 6:
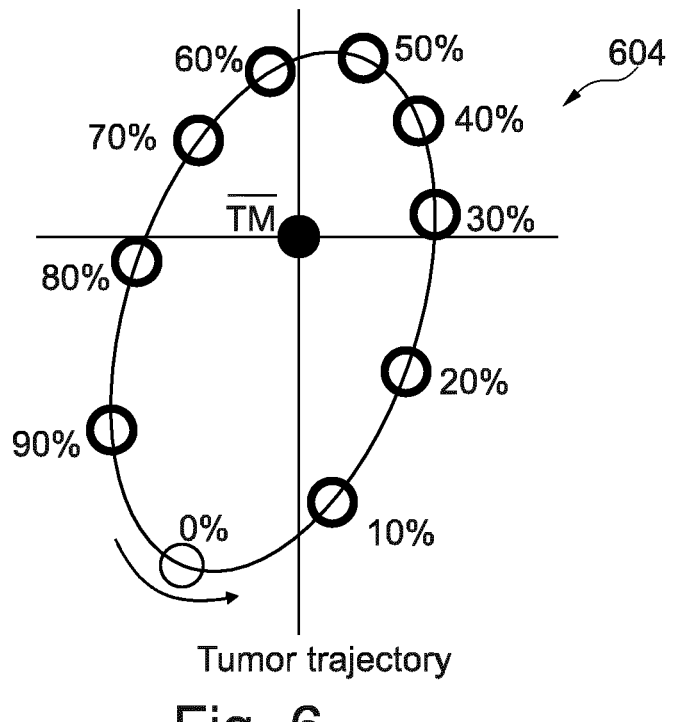

Examples may comprise one or more of the following features:

Acquiring 3D k-space with a temporally interleaved over-sampling of the central k-space preferably with a 3D variable density radial stack of stars sampling Detecting and classifying respiratory states distinguishing inspiration to expiration and expiration to inspiration respiratory states and breathing hysteresis effects Providing a respiratory histogram separating inspiration to expiration and expiration to inspiration respiratory states Removing respiratory outliers or weighting them with a low weight Sorting and binning the acquired data with respect to the detected and classified respiratory states Applying a k-space weighted filter in the respiratory state domain, weighting the oversampled central k-space stronger at equidistant respiratory states The invention proposal suggests an optimal binning scheme as illustrated in FIGS. 4 to 6.

FIG. 6 is used to illustrate a hysteresis effect for tumor motion when a subject breathes. There is a magnetic resonance image 600 shown. Within the image 600 is a segmentation 602 of a tumor. In this particular example, the position of the tumor 602 was noted for ten different locations along the phase trajectory of the subject's breathing. The plot 604 locates the centroid of the tumor 602 in the TM plane as a function of respiratory states. It can be seen that the tumor trajectory has a hysteresis effect and has a different location for inhalation and exhalation.

Figure 7:
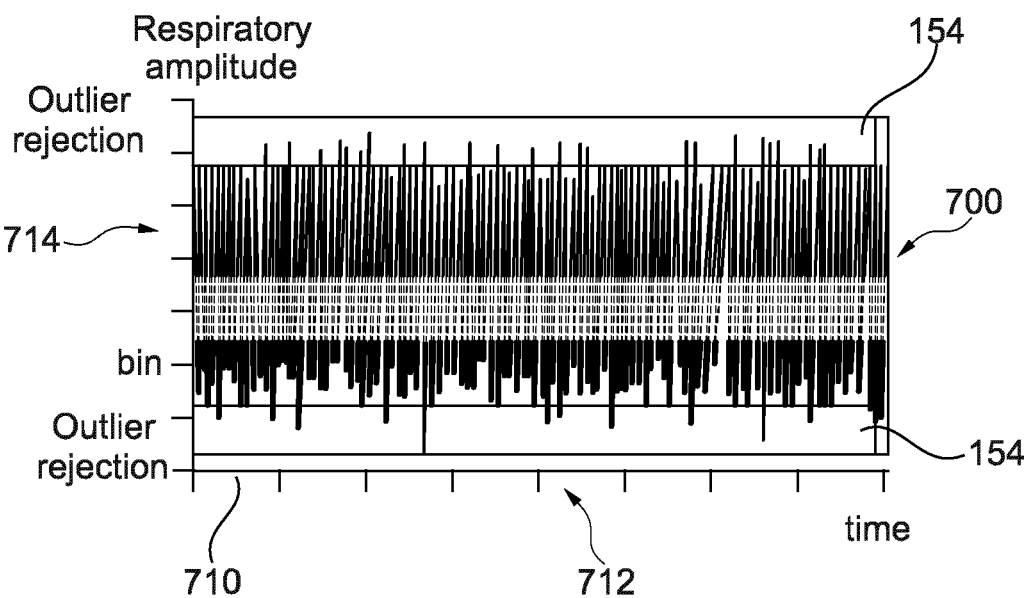
FIG. 7 shows a plot of a k-space intrinsic navigator.
Figure 7:
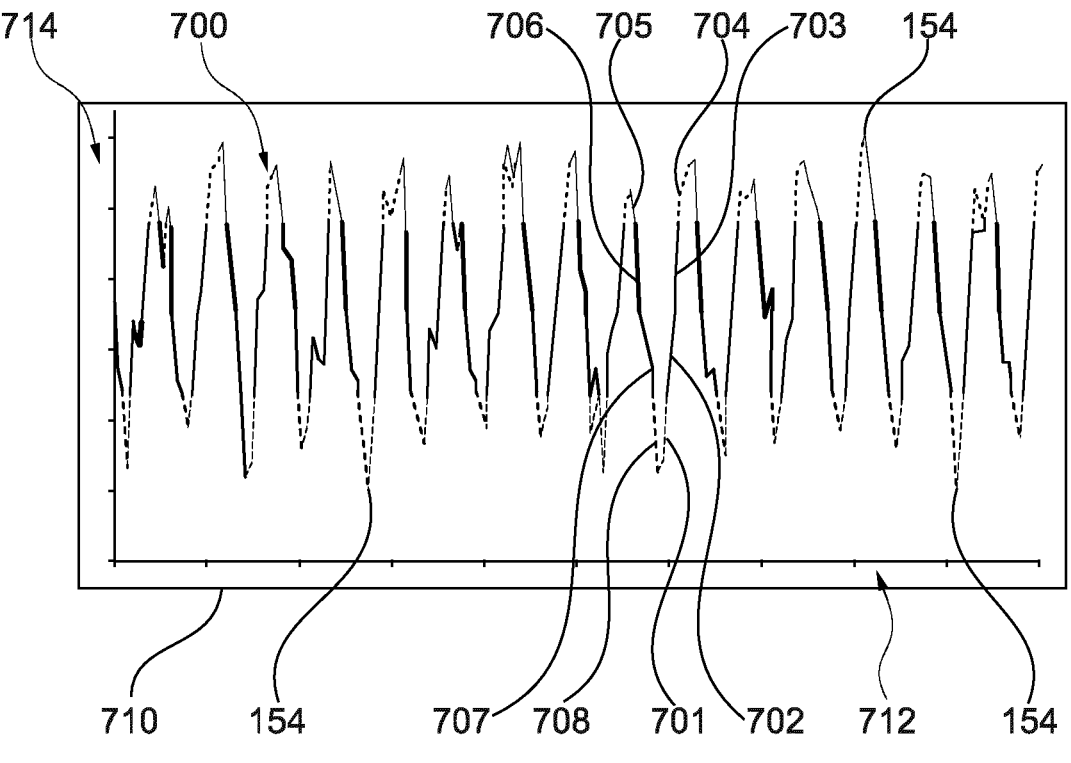
Figure 8:
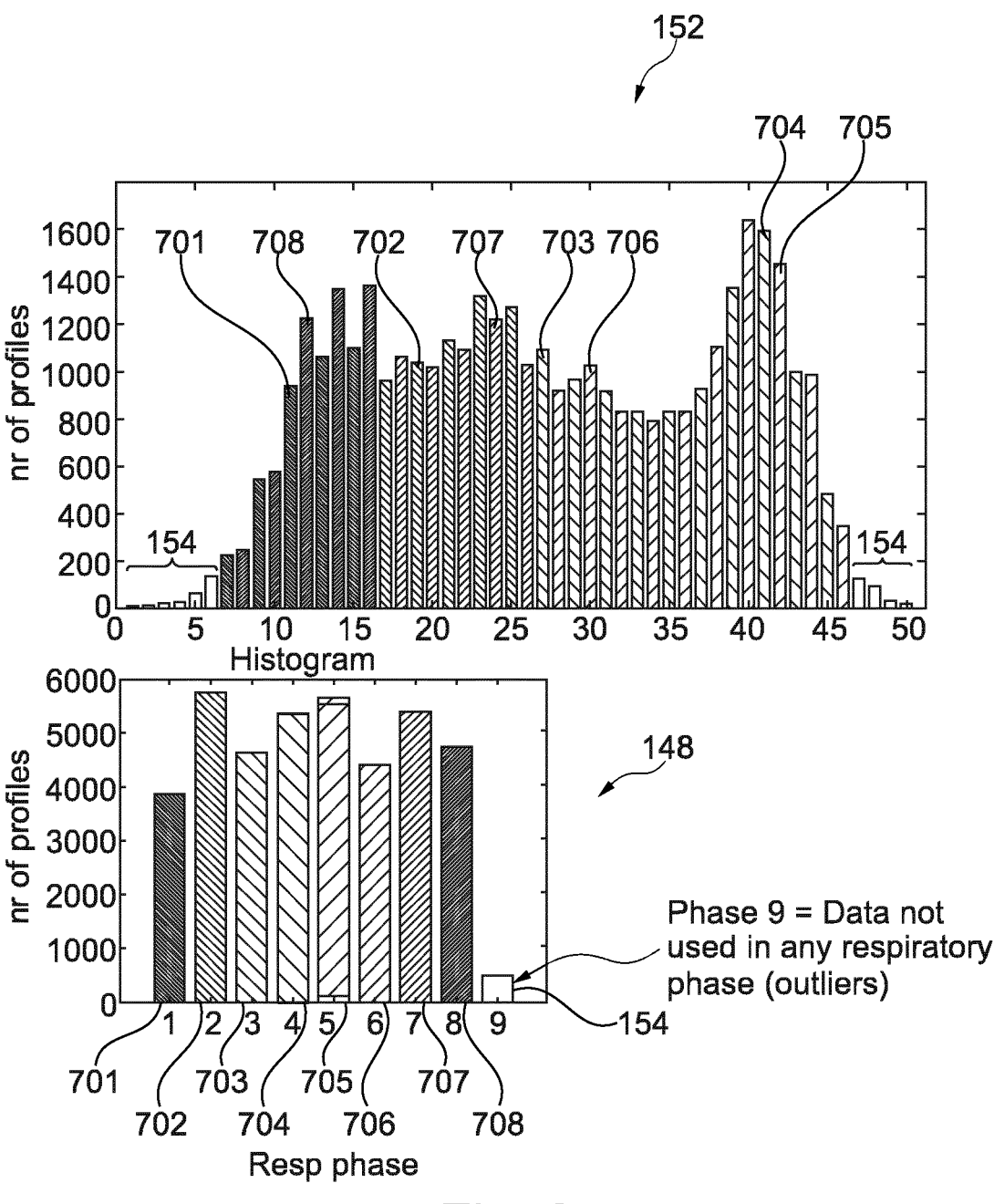
FIG. 8 illustrates a group of predetermined number of k-space bins 148 and a respiratory position histogram 152.

In FIGS. 7 and 8, the respiratory data is divided into eight different respiratory states. FIG. 7 shows a plot of a k-space intrinsic navigator 700. An expanded view of the k-space intrinsic navigator for the box 710 is shown below. The k-space intrinsic navigator 700 is shown as a function of time 712 and navigator value 714. The navigator is divided into eight portions or bins: 701 represents respiratory state or bin 1, 702 represents respiratory state or bin 2, 703 represents respiratory state or bin 3 and 704 represents respiratory state or bin 4. Bins 701, 702, 703, and 704 represent the inhalation of the subject. Respiratory state or bin 705 represents respiratory state or bin 5, 706 represents respiratory state or bin 6, 707 represents respiratory state or bin 7 and 708 represents respiratory state or bin 8. Bins 705, 706, 707, and 708 represent the exhalation of the subject.

FIG. 8 illustrates a group of predetermined number of k-space bins 148 and a respiratory position histogram 152 that were sorted using the navigator as illustrated in FIG. 7. The predetermined number of k-space bins 148 can be shown as containing k-space data for each of the eight respiratory states or bins 701-708. Additionally, there are some respiratory outliers 154 which are not used to reconstruct the respiratory-state resolved magnetic resonance image 150. To reconstruct the respiratory-state resolved magnetic resonance image 150 an image for each of the bins 701-708 is reconstructed.

The respiratory position histogram 152 sorts the k-space data according to its position and does not differentiate for the respiratory state, in which case states 701 and 708 are grouped together, states 702 and 707 are grouped together, states 703 and 706 are grouped together, and finally states 704 and 705 are grouped together. In other words, the respiratory position histogram 152, the k-space intrinsic navigator 700 is binned based on only the value of the navigator, inhalation and exhalation states are binned together This enables easy identification of the respiratory outliers 154.

3D k-space is acquired with a temporally interleaved oversampling of the central k-space. A 3D golden angle variable density radial stack of stars sampling may, in some examples, be used since it guarantees a good k-space sampling distribution, motion robustness with a higher k-space density at central kz-space providing a more efficient scanning and optimized filtering capability. The acquisition can be combined with an irregular sampling pattern optimized for compressed sensing and AI.

Respiratory states may be detected either from intrinsic k-space or externally from a camera—are classified with respect to the inspiration to expiration and expiration to inspiration respiratory state based on history accounting for respiratory hysteresis effects.

The acquired 3D k-space data is then sorted and binned with respect to the detected and classified respiratory states separating inspiration to expiration and expiration to inspiration respiratory states using a respiratory histogram (respiratory position histogram 152).

Respiratory outliers 154 are removed based on the histogram 152. Starting from the first and last bins, respectively, the bin is rejected if it is under a certain threshold. The threshold is a defined a factor (e.g., 0.1) times the height of the highest bin. The rejection of the outer bins is continued as long as the first bin over the threshold is encountered.

Figure 9:
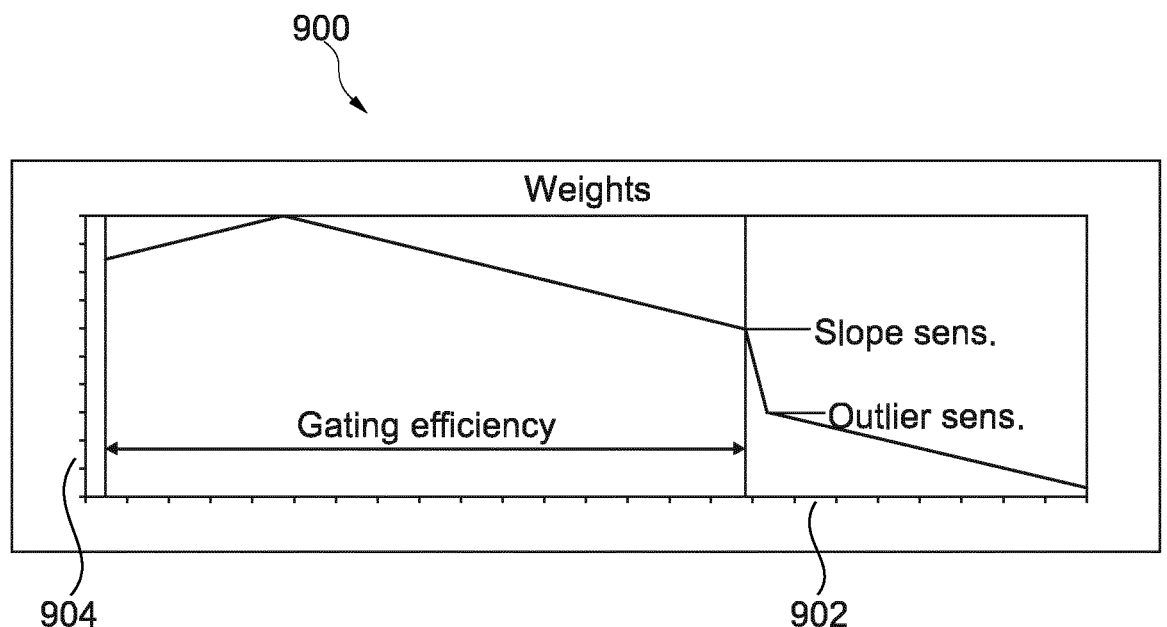
FIG. 9 illustrates a single KWIC filter for weighting k-space data based on position within or relative to a k-space bin.

FIG. 9 illustrates a KWIC filter 900 for a single k-space bin. This provides a weighting factor 904 as a function of the position in the bin 902. In this case it would be likely the navigator position. This weighting factor has a maximum located within a bin. The value of the KWIC filter may decrease rapidly to reduce the effect of outliers or samples outside of the particular bin.

Figure 10:
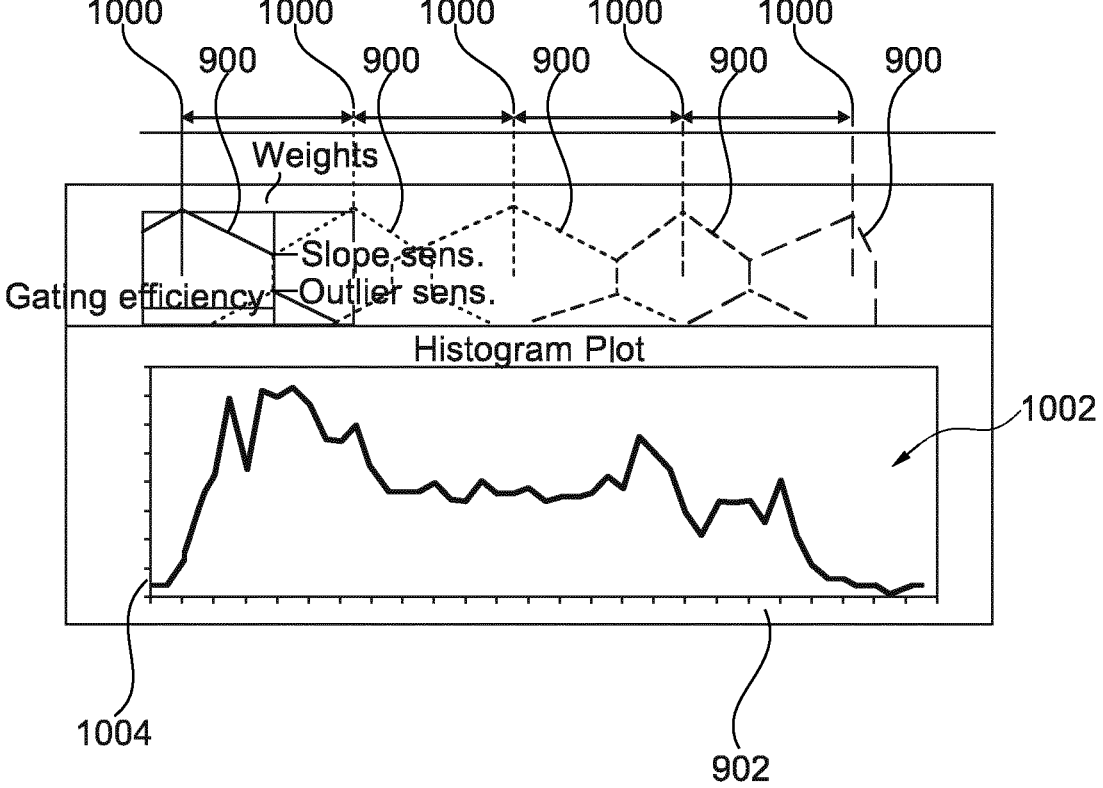
FIG. 10 illustrates a group of KWIC filters for multiple k-space bins.

FIG. 10 illustrates a collection of KWIC filters 900 that are applied to a histogram 1002 of k-space samples located in bins which are a function of navigator phase 902. In this example the KWIC filters 900 are used to define the boundaries and interaction of various bins. The k-space filter (KWIC) is applied to the acquired 3D k-space data for different respiratory bins. Vertical bars represent the center k-space 1000 that is weighted stronger at equidistant respiratory states.

Then a k-space weighted filter (KWIC) in the respiratory state domain is applied. Hereby the oversampled central k-space is weighted stronger at equidistant respiratory states than more distant k-space profiles. For illustration purposes the filtering is illustrated in FIG. 4 not accounting for the respiratory hysteresis effect. In the ideal those effects are accounted for by filtering the oversampled central k-space only with the correctly classified respiratory state.

Figure 11:
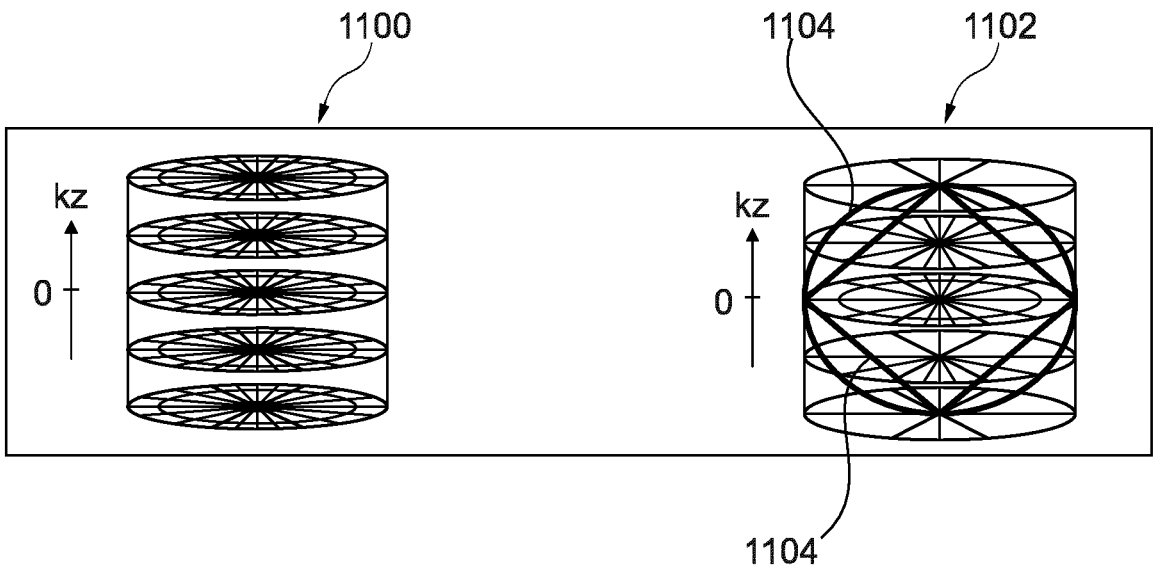
FIG. 11 illustrates an example of a three-dimensional golden angle stack of stars k-space sampling pattern and a three-dimensional variable density radial stack of stars k-space sampling pattern.
Figure 11:
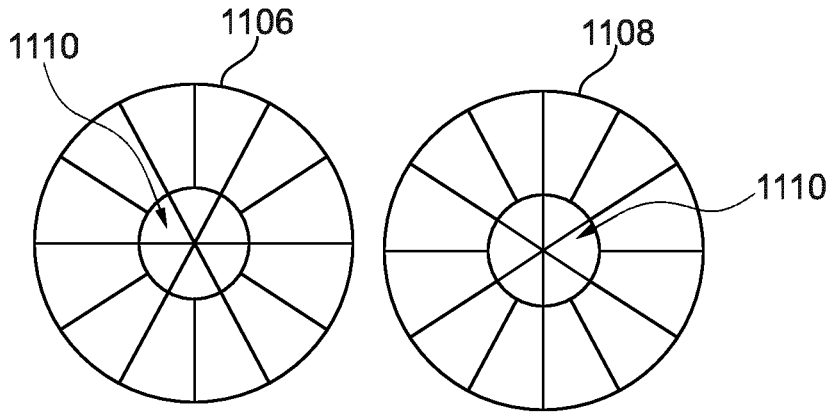

FIG. 11 illustrates several k-space sampling patterns. Sampling pattern 1100 is a standard three-dimensional golden angle stack of stars k-space sampling pattern. Sampling pattern 1102 is for a three-dimensional variable density radial stack of stars k-space sampling pattern. The lines 1104 marked in the three-dimensional variable density radial stack of stars k-space sampling pattern 1104 indicate how the different layers of the sampling pattern 1102 can be reduced in sampling by linear or quadratic radial densities for example. Outside of the regions marked 1104, the sampling pattern 1102 can be made sparser. Both sampling patterns 1100 and 1102 are examples of multi-dimensional k-space sampling patterns.

A very simplistic representation of the KWIC filter is shown with the peripheral k-space 1106 and 1108 shared over adjacent overlapping bins, while the central k-space part 1110 filters out respiratory-state distant profiles.

Regular undersampling, compressed sensing (CS) and artificial intelligence (AI) can be used to reconstruct respiratory state images distinguishing respiratory hysteresis effects. Next to spatial CS, a respiratory-state resolved CS reconstruction could be applied using a temporal total variation constraint. AI could be integrated in the (non-cartesian) CS reconstruction for improving de-noising and undersampling artifacts, but also for sharpening and providing super resolution images from the different respiratory states.

Figure 12:
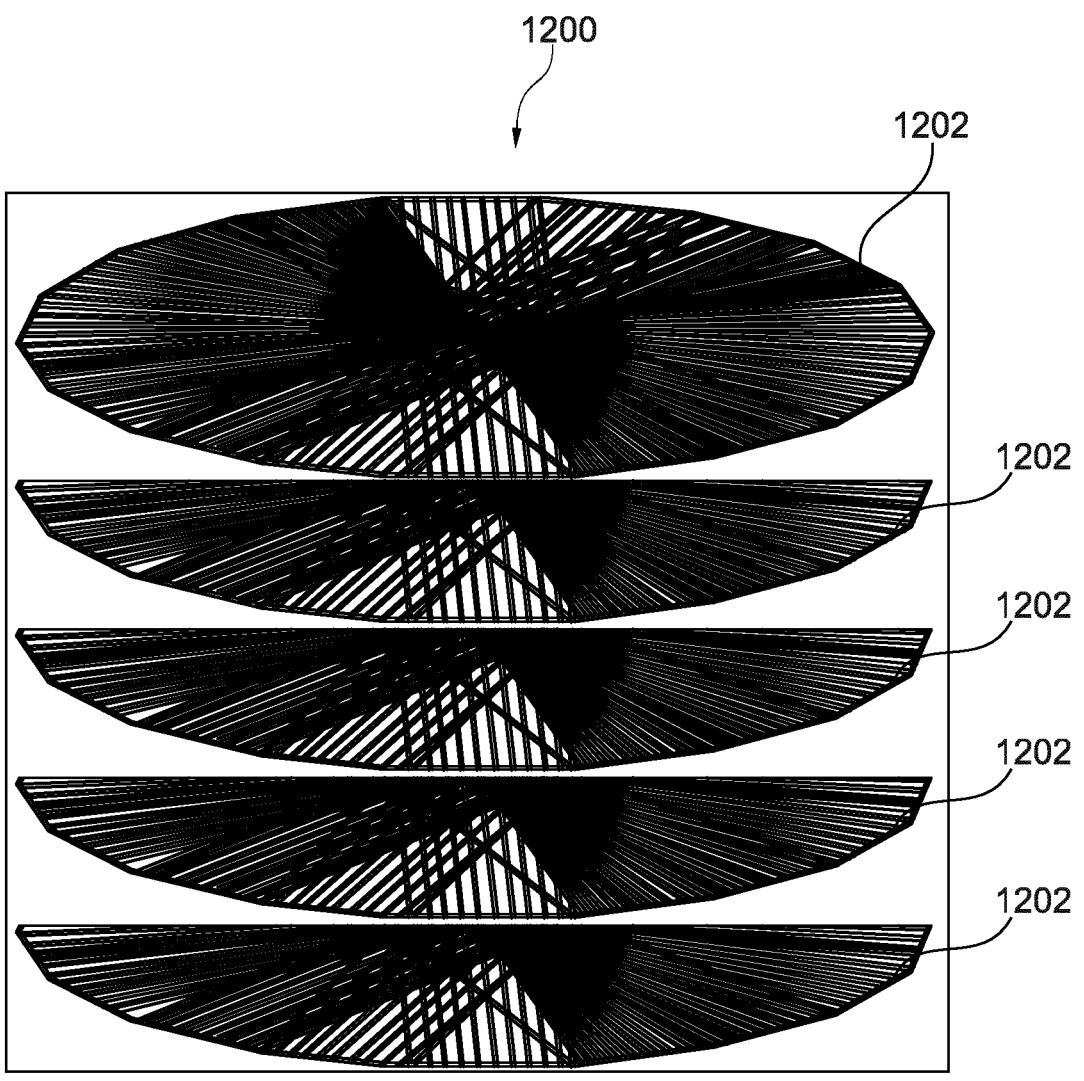
FIG. 12 shows a multi-slice Propeller k-space sampling pattern 1202.
Figure 13:
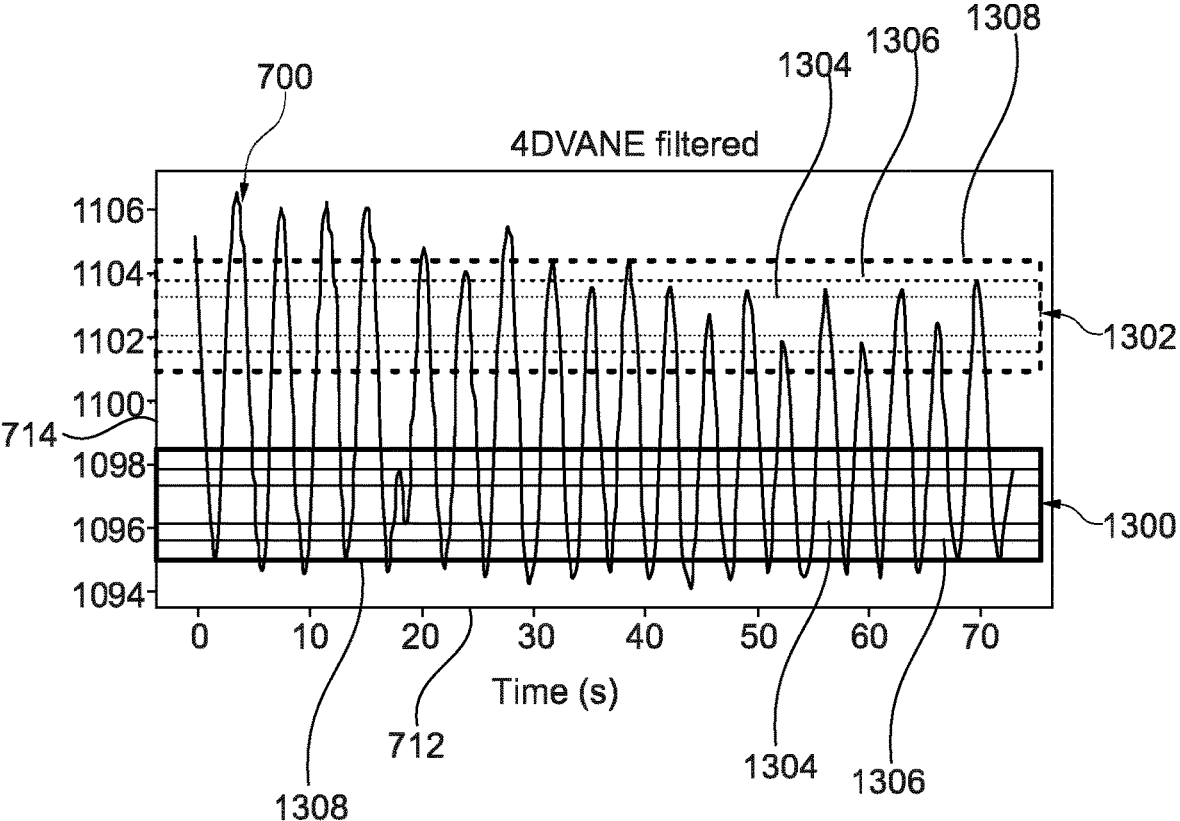
FIG. 13 shows two possible bins and at different respiratory states with the color code illustrating KWIC filter strengths; profiles within the blue margin is weighted strong whereas green and red are weighted much lower.
Figure 14:
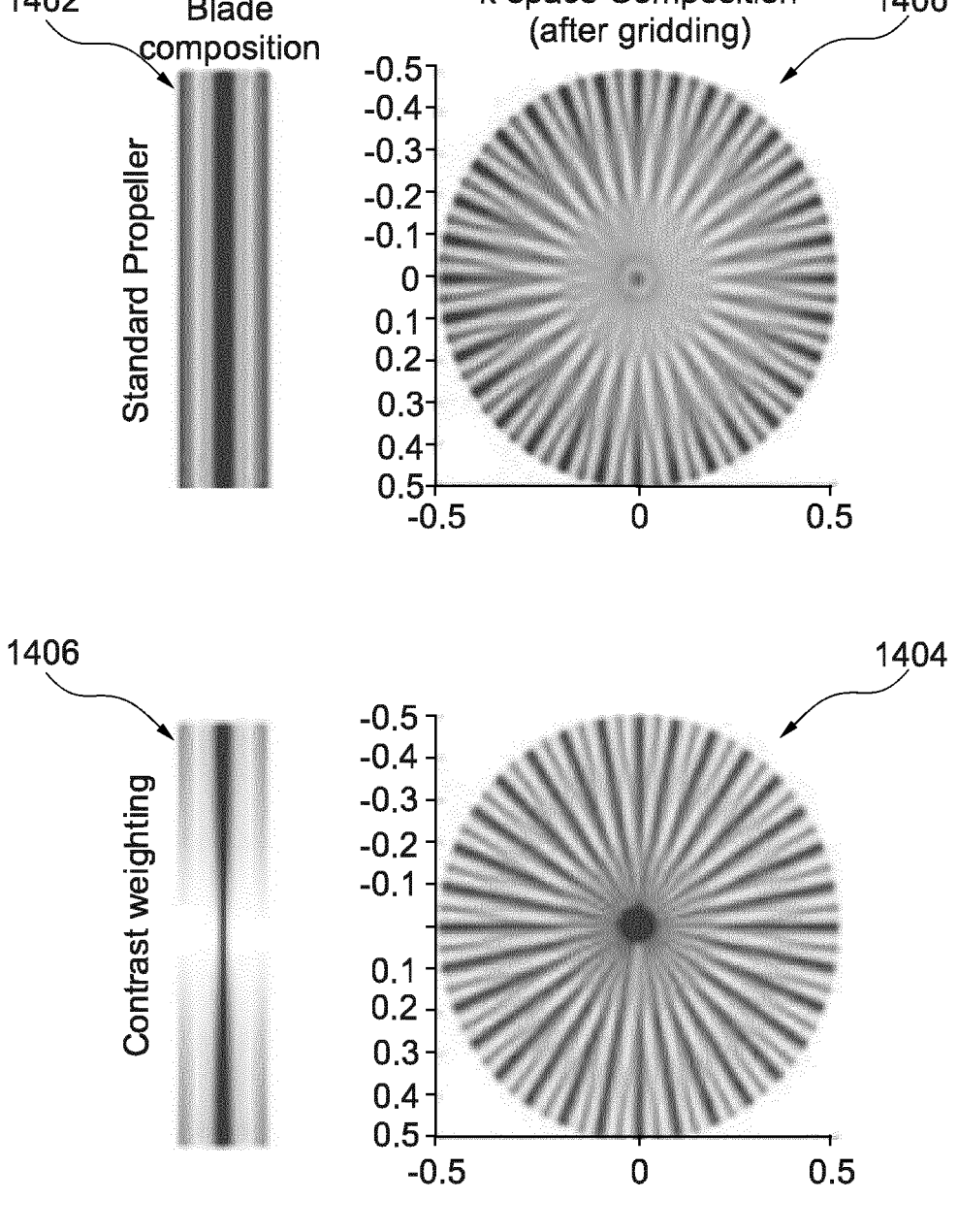
FIG. 14 illustrates contrast weighting of blades with respect to the respective respiratory states in FIG. 13 for k-space and blade composition for a standard propeller k-space sampling pattern. Standard Propeller with no contrast weighting is shown in 1400 and 1402 for k-space and blade composition.

FIGS. 12, 13, and 14 are used to illustrate the approach tuned to multi slice Propeller imaging. FIG. 12 shows a multi slice Propeller k-space sampling 1202. A multi slice two-dimensional propeller sampling with for example a desired T2 contrast has an intrinsic high oversampling of the central k-space. Using the respiratory information, the oversampled central k-space can be filtered out using KWIC filtering extracting 4D respiratory-state resolved T2 images within the same multi slice two-dimensional propeller overview scan.

FIG. 13 shows two possible bins 1300 and 1302 at different respiratory states with differing KWIC filter strengths. Each bin 1300 and 1302 each has 3 boxes: an inner box 1304, a middle box 1306, and an outer box 1308 which indicate the weighting of the KWIC filter. In both of these, provides the inner box 1304 is weighted the most and the outer box 1308 is weighted the least. As one moves further away from the inner region indicted by the inner box 1304 the weighting of the KWIC filter is reduced.

FIG. 14 illustrates contrast weighting of blades with respect to the respective respiratory states in FIG. 13 for k-space 1404 and blade composition 1406 for a standard propeller k-space sampling pattern. Standard Propeller with no contrast weighting is shown in 1400 and 1402 for k-space and blade composition. Propeller reconstruction can be combined with joint blade reconstruction and compressed sensing applying k-space weighting.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope. In the claims, the word "respiratory-state resolved" can be interchanged by "breathing resolved", "time resolved", "temporally resolved".

REFERENCE SIGNS LIST

100 medical system
102 magnetic resonance imaging system
104 magnet
106 bore of magnet
108 imaging zone
109 field of view
110 magnetic field gradient coils
112 magnetic field gradient coil power supply
114 radio-frequency coil
116 transceiver
118 subject
120 subject support
122 respiratory belt
130 computer
132 computational system
134 hardware interface
136 user interface
138 memory
140 machine executable instructions
142 pulse sequence commands
144 individual acquisitions of k-space data
146 respiratory signal
148 group of a predetermined number of k-space bins
150 respiratory-state resolved magnetic resonance image
152 respiratory position histogram
154 respiratory outliers
200 perform the individual acquisition of k-space data by controlling the magnetic resonance imaging system with the pulse sequence commands
202 receive the respiratory signal when the individual acquisition of k-space data is acquired by the magnetic resonance imaging system

204 bin the individually acquired k-space data into one of a predetermined number of k-space bins using the respiratory signal and inhalation or exhalation of the subject
206 acquisition finished?
208 reconstruct a magnetic resonance image for each of the predetermined number of k-space bins to provide a respiratory-state resolved magnetic resonance image of the field of view
300 repeatedly bin the individually acquired k-space data into a respiratory position histogram
302 identify respiratory outliers using the respiratory position histogram, wherein the respiratory-state resolved magnetic resonance image is corrected for the respiratory outliers
400 medical system
402 radiation therapy system
404 gantry
406 radiotherapy source
408 collimator
410 cryostat
412 superconducting coil
414 rotational axis
416 radiation beam
418 target zone
420 segmentation algorithm
422 respiratory-state resolved segmentation
424 radiation therapy system control module
426 radiation therapy plan
428 radiotherapy control commands
500 provide the respiratory-state resolved segmentation of the respiratory-state resolved magnetic resonance image by inputting the respiratory-state resolved magnetic resonance image into the segmentation algorithm
502 provide the radiotherapy control commands in response to inputting the respiratory-state resolved segmentation and the radiotherapy plan into the radiation therapy system control module
504 control the radiation therapy system to irradiate the subject using the radiotherapy control commands
600 magnetic resonance image
602 tumor segmentation
604 motion of centroid in TM plane
700 k-space intrinsic navigator
701 respiratory state or bin 1
702 respiratory state or bin 2
703 respiratory state or bin 3
704 respiratory state or bin 4
705 respiratory state or bin 5
706 respiratory state or bin 6
707 respiratory state or bin 7
710 box
712 time
714 navigator value
900 KWIC filtersingle bin
902 position in bin (navigator position)
904 weighting factor
1000 center of bin
1100 three-dimensional golden angle stack of stars k-space sampling pattern
1102 three-dimensional variable density radial stack of stars k-space sampling pattern
1104 region
1106 radial k-space sampling pattern
1108 radial k-space sampling pattern
1110 central region of k-space
1200 multi-dimensional k-space sampling pattern

1202 individual propeller sampling patterns

1300 continuous sampling of central k-space

1302 samples performed where the central k-space is partially filtered using a KWIC filter

1304 inner box

1306 middle box

1308 outer box

The invention claimed is:

1. A medical system comprising:

a magnetic resonance imaging system configured to acquire k-space data for a field of view of a subject, wherein the magnetic resonance imaging system is configured to provide a respiratory signal, wherein the respiratory signal is descriptive of a respiratory position of the subject, wherein the respiratory signal is further descriptive of inhalation and exhalation of the subject;

a memory configured to store machine executable instruction and pulse sequence commands, wherein the pulse sequence commands are configured to control the magnetic resonance imaging system to acquire the k-space data as multiple acquisitions of individually acquired k-space data according to a multi-dimensional k-space sampling pattern, wherein the pulse sequence commands are configured such that the multi-dimensional k-space sampling pattern is varied between each individual k-space data acquisition of the multiple acquisitions of k-space data; and a computational system, wherein execution of the machine executable instructions causes the computational system to repeatedly:

perform the individual acquisition of k-space data by controlling the magnetic resonance imaging system with the pulse sequence commands;

receive the respiratory signal when the individual acquisition of k-space data is acquired by the magnetic resonance imaging system;

bin the individually acquired k-space data into one of a predetermined number of k-space bins using the respiratory signal and inhalation or exhalation of the subject;

bin the individually acquired k-space data into a respiratory position histogram, wherein the respiratory position histogram does not differentiate in terms of inhalation and exhalation of the subject; and wherein execution of the machine executable instructions further causes the computational system to:

reconstruct a magnetic resonance image for each of the predetermined number of k-space bins to provide a respiratory-state resolved magnetic resonance image of the field of view; and identify respiratory outliers in the respiratory position histogram, wherein the respiratory-state resolved magnetic resonance image is corrected for the respiratory outliers.

2. The medical system of claim 1, wherein execution of the machine executable instructions further causes the computational system to calculate extreme respiratory-state resolved image data by calculating a modulus averaging or a complex averaging of extreme inspiration and expiration respiratory states in the respiratory-state resolved magnetic resonance image.

3. The medical system of claim 1, wherein the multi-dimensional k-space sampling pattern is configured to oversample a central k-space region.

4. The medical system of claim 1, wherein the multi-dimensional k-space sampling pattern is any one of a 3D stack of stars sampling pattern, a 3D variable density stack of stars sampling pattern, a 3D variable density spiral cartesian sampling pattern, a cartesian sampling pattern, a variable density sampling pattern, a 2D variable density cartesian sampling pattern, a 2D propeller sampling pattern, a KOOSH ball sampling pattern, a Floret sampling pattern, or a spiral sampling pattern including golden angle sampling strategies.

5. The medical system of claim 1, wherein execution of the machine executable instructions causes the computational system to apply a k-space weighting filter to each of the individual acquisitions of k-space data in the predetermined number of k-space bins before reconstructing the magnetic resonance image for each of the k-space bins, wherein the k-space filter is configured to apply a higher weighting to the central k-space region than outside the central k-space region.

6. The medical system of claim 5, wherein the individual acquisitions of k-space data are assigned a weighting by the k-space weighting filter according to location within or adjacent k-space bins determined by the respiratory signal.

7. The medical system of claim 5, wherein the k-space weighting filter is a k-space weighting image contrast filter and/or wherein the k-space weighting filter is configured to perform a phase correction to correct for motion and/or increase image sharpness according to a gradient entropy measure.

8. The medical system of claim 1, wherein the memory further stores a segmentation algorithm configured to output a respiratory-state resolved segmentation in response to receiving the respiratory-state resolved magnetic resonance image, wherein execution of the machine executable instructions further causes the computational system to provide the respiratory-state resolved segmentation of the respiratory-state resolved magnetic resonance image by inputting the respiratory-state resolved magnetic resonance image into the segmentation algorithm.

9. The medical system of claim 8, wherein the memory further stores a radiation therapy system control module configured to output control commands for a radiotherapy system in response to receiving the respiratory-state resolved segmentation and a radiotherapy plan as input, wherein execution of the machine executable instructions further causes the computational system to provide the radiotherapy control commands in response to inputting the respiratory-state resolved segmentation and the radiotherapy plan into the radiation therapy system control module.

10. The medical system of claim 9, wherein the medical system further comprises the radiation therapy system, wherein execution of the machine executable instructions further causes the computational system to control the radiation therapy system to irradiate the subject using the radiotherapy control commands, wherein the irradiation of the subject is at least partially controlled, gated, tracked, and/or followed using the respiratory signal.

11. The medical system of claim 1, wherein the magnetic resonance image for each of the predetermined number of k-space bins is reconstructed using compressed sensing or an artificial intelligence based reconstruction.

12. The medical system of claim 1, wherein the respiratory-state resolved magnetic resonance image is corrected for the respiratory outliers by deleting outliers from the k-space bins.

13. The medical system of claim 2, wherein the extreme inspiration and expiration respiratory states comprise end inspiration or end expiration states, or an automated selection of extreme states by gradient entropy comparison and/or selection of pre-selected gating window settings.

14. The medical system of claim 2, wherein the extreme inspiration and expiration respiratory states comprise an automated selection of extreme states by gradient entropy comparison and/or selection of pre-selected gating window settings.

15. The medical system of claim 1, wherein the respiratory-state resolved magnetic resonance image is corrected for the respiratory outliers by giving respiratory outliers a predetermined weighting value during reconstruction of the magnetic resonance image for each of the predetermined number of k-space bins.

16. A computer program product comprising machine executable instructions, stored on a non-transitory computer readable medium, for execution by a computational system controlling a medical system, wherein the medical system comprises a magnetic resonance imaging system configured to acquire k-space data for a field of view of a subject, wherein the magnetic resonance imaging system is configured to provide a respiratory signal, wherein the respiratory signal is descriptive of a respiratory position of the subject, wherein the respiratory signal is further descriptive of inhalation and exhalation of the subject, wherein execution of the machine executable instructions causes the computational system to repeatedly:

perform the individual acquisition of k-space data by controlling the magnetic resonance imaging system with pulse sequence commands, wherein the pulse sequence commands are configured to perform the acquiring of the k-space data as multiple acquisitions of individually acquired k-space data according to a multi-dimensional k-space sampling pattern, wherein the pulse sequence commands are configured such that the multi-dimensional k-space sampling pattern is varied between each individual k-space data acquisition of the multiple acquisitions of k-space data;

receive the respiratory signal during acquisition of the individual acquired k-space data; and bin the individually acquired k-space data into one of a predetermined number of k-space bins using the respiratory signal and inhalation or exhalation of the subject;

repeatedly bin the individually acquired k-space data into a respiratory position histogram, wherein the respiratory position histogram does not differentiate in terms of inhalation and exhalation of the subject;

wherein execution of the machine executable instructions further causes the computational system to reconstruct a magnetic resonance image for each of the k-space bins to provide a respiratory-state resolved magnetic resonance image of the field of view; and wherein execution of the machine executable instructions further causes the computational system to identify respiratory outliers using the respiratory position histogram, and wherein the respiratory-state resolved magnetic resonance image is corrected for the respiratory outliers.

17. A method of operating a medical system, wherein the medical system comprises a magnetic resonance imaging system configured to acquire k-space data for a field of view of a subject, wherein the magnetic resonance imaging system is configured to provide a respiratory signal, wherein the respiratory signal is descriptive of a respiratory position of the subject, wherein the respiratory signal is further descriptive of inhalation and exhalation of the subject;

wherein the method comprises repeatedly:

performing the individual acquisition of k-space data by controlling the magnetic resonance imaging system with pulse sequence commands, wherein the pulse sequence commands are configured to perform the acquiring of the k-space data as multiple acquisitions of individually acquired k-space data according to a multi-dimensional k-space sampling pattern, wherein the pulse sequence commands are configured such that the multi-dimensional k-space sampling pattern is varied between each individual k-space data acquisition of the multiple acquisitions of k-space data;

receiving the respiratory signal during acquisition of the individual acquired k-space data;

binning the individually acquired k-space data into one of a predetermined number of k-space bins using the respiratory signal and inhalation or exhalation of the subject;

repeatedly binning the individually acquired k-space data into a respiratory position histogram, wherein the respiratory position histogram does not differentiate in terms of inhalation and exhalation of the subject;

reconstructing a magnetic resonance image for each of the k-space bins to provide a respiratory-state resolved magnetic resonance image of the field of view; and identifying respiratory outliers using the respiratory position histogram, and correcting the respiratory-state resolved magnetic resonance image for the respiratory outliers.

18. The method of claim 17, further comprising:

calculating extreme respiratory-state resolved image data by calculating a modulus averaging or a complex averaging of extreme inspiration and expiration respiratory states in the respiratory-state resolved magnetic resonance image.

19. The method of claim 17, wherein correcting the respiratory-state resolved magnetic resonance image for the respiratory outliers comprises deleting outliers from the k-space bins or by giving respiratory outliers a predetermined weighting value during reconstruction of the magnetic resonance image for each of the predetermined number of k-space bins.

20. The method of claim 17, wherein correcting the respiratory-state resolved magnetic resonance image for the respiratory outliers comprises giving respiratory outliers a predetermined weighting value during reconstruction of the magnetic resonance image for each of the predetermined number of k-space bins.

* * * * *